(12) United States Patent
Choi

(10) Patent No.: US 11,319,211 B2
(45) Date of Patent: May 3, 2022

(54) GRAPHITE COMPOSITION, MASTERBATCH COMPRISING SAME, AND GRAPHITE COMPOSITE MATERIAL EMBODIED THEREBY

(71) Applicant: AMOGREENTECH CO., LTD., Gimpo-si (KR)

(72) Inventor: Seung Jin Choi, Seoul (KR)

(73) Assignee: Amogreentech Co., Ltd., Gimpo-si (KR)

( * ) Notice: Subject to any disclaimer, the term of this patent is extended or adjusted under 35 U.S.C. 154(b) by 409 days.

(21) Appl. No.: 16/606,297

(22) PCT Filed: Apr. 20, 2018

(86) PCT No.: PCT/KR2018/004607
§ 371 (c)(1),
(2) Date: Oct. 18, 2019

(87) PCT Pub. No.: WO2018/194418
PCT Pub. Date: Oct. 25, 2018

(65) Prior Publication Data
US 2021/0188648 A1    Jun. 24, 2021

(30) Foreign Application Priority Data

Apr. 20, 2017 (KR) .................. 10-2017-0051154
Apr. 20, 2017 (KR) .................. 10-2017-0051164
Apr. 20, 2017 (KR) .................. 10-2017-0051169

(51) Int. Cl.
*C01B 32/225* (2017.01)
*C08K 3/04* (2006.01)
(Continued)

(52) U.S. Cl.
CPC .......... *C01B 32/225* (2017.08); *C01B 32/205* (2017.08); *C08K 3/042* (2017.05);
(Continued)

(58) Field of Classification Search
CPC ..... C01B 32/225; C01B 32/205; C01B 32/21; C01B 32/182; C01B 32/198;
(Continued)

(56) References Cited

U.S. PATENT DOCUMENTS

2017/0107355 A1*  4/2017  Kim .................. C08K 3/04

FOREIGN PATENT DOCUMENTS

JP          1327227 B1    9/2009
JP       2009293326 A    12/2009
(Continued)

OTHER PUBLICATIONS

Machine Translation of Abstract for JP 2009293326A to Oku En Tout Cas Co Ltd (Dec. 17, 2009) (Year: 2009).*
(Continued)

*Primary Examiner* — Daniel C. McCracken
(74) *Attorney, Agent, or Firm* — Rothwell, Figg, Ernst & Manbeck, P.C.

(57) ABSTRACT

A graphite composition is provided. A graphite composition according to one embodiment of the present invention comprises: a graphite composite in which nanoparticles having a catecholamine layer on the surface thereof are fixed on graphite; and graphite of at least one of graphite flakes, spherical graphite, and expanded graphite. According to this, since the graphite composition has a high dispersibility in a substrate of a different material, a composite material thus realized exhibits a uniform heat dissipation performance and can prevent mechanical strength from deteriorating at a specific position. In addition, since the compatibility with the substrate of a different material is excellent and thus the interface property with the substrate is excellent, the realized composite material can exhibit a further improved heat dissipation performance and mechanical strength. Furthermore, it is very easy to form shapes during injection/
(Continued)

extrusion molding in combination with a substrate, and molding into complicated shapes is also possible.

13 Claims, 6 Drawing Sheets

(51) Int. Cl.

| | |
|---|---|
| *C01B 32/205* | (2017.01) |
| *C08K 9/04* | (2006.01) |
| *C08L 57/00* | (2006.01) |
| *C08L 87/00* | (2006.01) |
| *C09C 3/10* | (2006.01) |
| *B82Y 30/00* | (2011.01) |
| *B82Y 40/00* | (2011.01) |

(52) U.S. Cl.
CPC ............... *C08K 9/04* (2013.01); *C08L 57/00* (2013.01); *C08L 87/00* (2013.01); *C09C 3/10* (2013.01); *B82Y 30/00* (2013.01); *B82Y 40/00* (2013.01); *C01P 2004/32* (2013.01); *C01P 2004/61* (2013.01); *C01P 2004/64* (2013.01); *C08L 2310/00* (2013.01)

(58) Field of Classification Search
CPC ............ C01B 2204/00; C01B 2204/02; C01B 2204/04; C01B 2204/06; C01B 2204/065; C01B 2204/20; C01B 2204/22; C01B 2204/24; C01B 2204/26; C01B 2204/28; C01B 2204/30; C01B 2204/32; C01B 32/20; C01B 32/215; C01B 32/22; C01B 32/23; C08K 3/042; C08K 9/04; C08K 3/04; C08K 9/02; C08K 2201/005; C08L 57/00; C08L 87/00; C08L 2310/00; C08L 21/00; C08L 23/16; C08L 75/04; C08L 23/26; C09C 3/10; C09C 1/56; C09C 1/60; C09C 1/46; B82Y 30/00; B82Y 40/00; C01P 2004/32; C01P 2004/61; C01P 2004/64; C01P 2004/20; C01P 2004/62; C01P 2006/80; H05K 7/20; B32B 27/20; C08J 3/22

See application file for complete search history.

(56) References Cited

FOREIGN PATENT DOCUMENTS

| | | | |
|---|---|---|---|
| KR | 101247119 B1 | 4/2013 | |
| KR | 20140093457 A | 7/2014 | |
| KR | 101509853 B1 | 4/2015 | |
| KR | 20150110058 A | 10/2015 | |
| KR | 20160031103 A | 3/2016 | |
| KR | 20160042299 A | 4/2016 | |
| KR | 101679698 B1 | 11/2016 | |
| WO | WO 2015/147501 | * 10/2015 | ............... C08K 9/04 |

OTHER PUBLICATIONS

Machine Translation of Abstract for JP 4327227B1 to Oku En-Tout-Cas Co Ltd (Sep. 9, 2009) (Year: 2009).*
Machine Translation of Abstract for KR 20140093457A to LG Electronics Inc (Jul. 28, 2014) (Year: 2014).*
Machine Translation of Abstract for KR 20150110058A to Cheorwon Plasma Res Inst (Oct. 2, 2015) (Year: 2015).*
Machine Translation of Abstract for KR 20160031103A to Nat Univ Chonbuk Ind Coop Found (Mar. 22, 2016) (Year: 2016).*
Machine Translation of Abstract for KR 20160042299A to Amogreentech Co Ltd (Apr. 19, 2016) (Year: 2016).*
Machine Translation of Abstract for KR 101509853B1 to Hyundai Motor Company (Apr. 6, 2015) (Year: 2015).*
Machine Translation of Abstract for KR 101679698B1 to Korea Electronics Technology (Nov. 25, 2016) (Year: 2016).*
Machine Translation of Abstract for KR 101247119B1 to Oh Dong Hoon, Korea Inst Footwear & Leather etc. (Apr. 2, 2013) (Year: 2013).*
Instructions for Information Disclosure Statement, accessed online at https://www.uspto.gov/patents/apply/applying-online/form-fillable-pdfs-available (Mar. 28, 2014) (Year: 2014).*

* cited by examiner

X-X'

GRAPHITE COMPOSITION, MASTERBATCH COMPRISING SAME, AND GRAPHITE COMPOSITE MATERIAL EMBODIED THEREBY

CROSS REFERENCE TO RELATED APPLICATIONS

This application is a 35 U.S.C. 371 National Phase Entry Application from PCT/KR2018/004607, filed Apr. 20, 2018, designating the United States, which claims the benefit of Korean Patent Application Nos. 10-2017-0051169, 10-2017-0051164 and 10-2017-0051154 all filed on Apr. 20, 2017, and the disclosures of all of which are incorporated herein in their entireties by reference.

BACKGROUND

The present invention relates to a graphite composition, and more particularly, to a graphite composition which can embody a heat dissipation member that is very lightweight, has very excellent heat dissipation performance, is easily injection-molded into various shapes, and has excellent mechanical strength and durability of an injection-molded product, a masterbatch including the same, and a graphite composite material prepared using the same.

In electronic components, lighting, converter housings and other devices generating undesired heat, heat accumulation may greatly limit a working life and reduce operating efficiency. Metals, which are excellent thermal conductors, have generally been used as thermal management units such as a heat sink and a heat exchanger. However, the metal parts are very heavy and have high production costs.

Recently, a heat dissipation member manufactured using an injection-moldable or extrudable polymer resin has been proposed, and due to the advantages of a light weight and low cost because of material properties of the polymer resin itself, a variety of studies have been being conducted.

The heat dissipation member includes a heat-dissipation filler to exhibit a desired heat dissipation property, wherein the heat-dissipation filler has to be dissimilar to a polymer resin having low thermal conductivity due to the quality of the material, such that there are problems in terms of compatibility between dissimilar materials. As an example, ideally, uniform dispersion of the heat-dissipation filler in the polymer resin may be advantageous in terms of heat dissipation performance, but practically, the heat-dissipation filler is concentrated at a specific position of the polymer resin while being easier to disperse. In this case, there are problems of a significant decrease in heat dissipation performance, and a significant decrease in mechanical strength due to frequent cracking or breakage at a specific position in which the heat-dissipation filler is concentrated. In addition, when the content of the heat-dissipation filler in the heat dissipation member is excessively high, the mechanical strength of the manufactured heat dissipation member is significantly lowered and difficult to mold, and therefore, there is a problem that the content of the heat-dissipation filler that can be included in the heat dissipation member is limited.

For this reason, there is a urgent need to develop a heat-dissipation filler composition which can ensure a light weight, sufficiently exhibit heat dissipation performance to a desired level, and manufacture a heat dissipation member having excellent mechanical strength and durability and an excellent ability to facilitate injection molding.

SUMMARY OF THE INVENTION

The present invention has been made based on the above-described problems, and is directed to providing a graphite composition which may exhibit excellent dispersity in a matrix of a different material, thereby exhibiting uniform heat dissipation performance, and prevent a decrease in mechanical strength at a specific position.

In addition, the present invention is also directed to providing a graphite composition which may exhibit more improved heat dissipation performance and mechanical strength due to an excellent interfacial property with a matrix, caused by excellent compatibility with the matrix, which is dissimilar to the graphite composition, improve ease of molding during molding through injection/extrusion, and be capable of being molded in a complicated shape.

Further, the present invention is also directed to providing a masterbatch for preparing a graphite composite material, which may easily prepare a composite material through the graphite composition according to the present invention.

Furthermore, the present invention is also directed to providing a graphite composite material which exhibits excellent heat dissipation performance, ensures excellent mechanical strength, is very lightweight, exhibits excellent economic feasibility, and is realized even in a complicated shape.

Moreover, the present invention is also directed to providing a heat-dissipation composite material which may exhibit excellent heat dissipation performance, ensure excellent mechanical strength, exhibit excellent durability, and exhibit long-term heat dissipation performance, such that it can be applied to a support of a heat source, an external housing, etc., and an electrical/electronic part using the same.

To solve the above-described problems, the first aspect of the present invention provides a graphite composition, which includes: a graphite complex having nanoparticles fixed on a graphite surface; and at least one graphite of graphite flakes, spherical graphite and expanded graphite.

According to an exemplary embodiment of the present invention, the graphite complex may further include a catecholamine layer on at least the nanoparticles.

In addition, the graphite complex and the graphite may be included at a weight ratio of 1:1 to 25, and more preferably, 1:15.

In addition, the graphite complex may further include a polymer layer disposed to coat at least the catecholamine layer.

In addition, the graphite complex may have an average particle size of 10 to 900 µm. In addition, the graphite complex may have an average particle size of 50 to 600 µm. In addition, the graphite flake may have an average particle size of 10 to 1,000 µm, the expanded graphite may have an average particle size of 50 to 1,000 µm, and the spherical graphite may have an average particle size of 10 to 100 µm.

In addition, the graphite may be expanded graphite. In addition, the graphite may include graphite flakes and expanded graphite, wherein the expanded graphite and the graphite flakes may be included at a weight ratio of 1:1 to 20, and more preferably, 1:1 to 13.

In addition, the present invention provides a masterbatch for preparing a graphite composite material, which includes the graphite composition according to the present invention and a thermoplastic polymer compound.

According to an exemplary embodiment of the present invention, the graphite composition may be included at 20 to 80 wt % with respect to the total weight of the masterbatch.

In addition, the thermoplastic polymer compound may include one type of compound selected from the group consisting of polyamide, polyester, polyketone, a liquid crystal polymer, polyolefin, polyphenylene sulfide (PPS), polyether ether ketone (PEEK), polyphenylene oxide (PPO), polyethersulfone (PES), an acrylonitrile-butadiene-styrene (ABS) copolymer, polyetherimide (PEI) and polyimide, or a mixture or copolymer of two or more thereof.

In addition, the present invention provides a graphite composite material, which includes a heat-dissipation filler including a polymer matrix molded by including a thermoplastic polymer compound and a graphite composition according to the present invention dispersed in the polymer matrix.

According to an exemplary embodiment of the present invention, the graphite composite material may further include one or more types of strength modifiers selected from the group consisting of carbon fiber, glass fiber, calcium carbonate, magnesium carbonate, mica, talc, silicon carbide, kaolin, calcium sulfate, barium sulfate, silicon dioxide, ammonium hydroxide, magnesium hydroxide and aluminum hydroxide, and here, the strength modifiers may be included at 0.1 to 30 parts by weight with respect to 100 parts by weight of the graphite composition.

In addition, the graphite composite material may further include one impact modifier of thermoplastic polyurethane (TPU) and thermoplastic polyolefin (TPO), and here, the impact modifier may be included at 0.1 to 30 parts by weight with respect to 100 parts by weight of the graphite composition. In addition, the graphite composite material may further include one or more additives selected from the group consisting of a dispersing agent, an antioxidant, a work modifier, a coupling agent, a flame retardant, a light stabilizer, a heat stabilizer and a UV absorber.

In addition, the graphite composite material may further include a protective coating layer on at least a part of the outer surface of the polymer matrix.

In addition, the present invention provides a graphite composite material, which includes a polymer matrix molded by including a thermoplastic polymer compound to form a core part and coating parts surrounding the core part, a first heat dissipating filler including the graphite composition according to the present invention, which is dispersed in the core part, and a pigment dispersed in the coating parts.

According to an exemplary embodiment of the present invention, the coating part may further include a second heat dissipating filler.

In addition, the present invention provides a heat-dissipation composite material, which includes the graphite composite material according to the present invention, and a support member included to form at least one interface with the polymer matrix of the graphite composite material.

In addition, to solve the above-described problems, the second aspect of the present invention provides a heat-dissipation composite material, which includes a heat-dissipation filler including a polymer matrix, a metallic support layer included to form at least one interface with the polymer matrix, and a graphite complex in which nanoparticles dispersed in the polymer matrix and serving as an anchor at the interface formed with any one or more of the metallic support layer and the polymer matrix are included on a graphite surface.

According to an exemplary embodiment of the present invention, to improve adhesive strength at the interface formed with any one or more of the metallic support layer and the polymer matrix, the graphite complex may further include a catecholamine layer disposed to coat at least the nanoparticles.

In addition, the graphite complex may further include a polymer layer disposed to coat at least the catecholamine layer to improve adhesive strength at the interface formed with the polymer matrix.

In addition, the graphite complex may have an average particle size of 10 to 900 μm. In addition, the heat-dissipation filler may further include graphite including any one or more of graphite flakes, expanded graphite and spherical graphite to prevent agglomeration of the graphite complexes. Here, the graphite flake may have an average particle size of 10 to 1,000 μm, the expanded graphite may have an average particle size of 50 to 1,000 μm, and the spherical graphite may have an average particle size of 10 to 100 μm.

In addition, the heat-dissipation filler may further include graphite including any one or more of graphite flakes, expanded graphite and spherical graphite, and the graphite complex and the graphite may be included at a weight ratio of 1:1 to 25, and more preferably, 1:15. Here, the graphite may be expanded graphite. In addition, the graphite may include graphite flakes and expanded graphite, wherein the expanded graphite and graphite flakes may be included at a weight ratio of 1:1 to 20, and more preferably, 1:1 to 13.

In addition, the polymer matrix may include one type of compound selected from the group consisting of polyamide, polyester, polyketone, a liquid crystal polymer, polyolefin, polyphenylene sulfide (PPS), polyether ether ketone (PEEK), polyphenylene oxide (PPO), polyethersulfone (PES), an acrylonitrile-butadiene-styrene hybrid polymer (ABS), polyetherimide (PEI) and polyimide, or a mixture or copolymer of two or more thereof.

In addition, the metallic support layer may be one type of metal selected form the group consisting of aluminum, magnesium, iron, titanium and copper, or an alloy including at least one type of metal thereof. Here, the metallic support layer may have a thickness 0.5 to 90% of the total thickness of the heat-dissipation composite material.

In addition, the nanoparticles may have an average particle size of 5 to 65 nm, and more preferably, 10 to 50 nm.

In addition, the metallic support layer may further include one or more types of strength modifiers selected from the group consisting of carbon fiber, glass fiber, calcium carbonate, magnesium carbonate, mica, talc, silicon carbide, kaolin, calcium sulfate, barium sulfate, silicon dioxide, ammonium hydroxide, magnesium hydroxide and aluminum hydroxide, and here, the strength modifier may be included at 0.5 to 200 parts by weight with respect to 100 parts by weight of the heat-dissipation filler. In addition, the metallic support layer may further include an impact modifier including natural rubber, or one or more types of synthetic rubber selected from the group consisting of styrene butadiene rubber (SBR), butadiene rubber (BR), chloroprene rubber (CR), isoprene rubber (IR), isobutene isoprene rubber (IIR), acrylonitrile-butadiene rubber (NBR), ethylene propylene rubber (EPR), ethylene propylene diene monomer rubber, acrylic rubber, silicone rubber, fluorine rubber and urethane rubber. Here, the impact modifier may be included at 0.5 to 200 parts by weight with respect to 100 parts by weight of the heat-dissipation filler. In addition, the metallic support layer may further include one or more types of additives selected from the group consisting of a dispersing agent, an antioxidant, a work modifier, a coupling agent, a flame retardant, a light stabilizer, a heat stabilizer and a UV absorber.

In addition, a protective coating layer may be provided on at least a part of the outer surface of the polymer matrix, and more preferably, the protective coating layer is a heat-dissipation coating layer.

In addition, the present invention provides a method of preparing a heat-dissipation composite material, which includes: preparing a heat-dissipation filler, which includes a graphite complex having nanoparticles serving as an anchor at the interface formed with any one or more of a metallic support layer and a polymer matrix, and a polymer matrix composition including a polymer compound as a main material resin forming the polymer matrix; and molding the graphite composition to be provided on at least one surface of the metallic support layer.

In addition, the present invention provides a heat-dissipation filler for a heat-dissipation composite material, which is included in a polymer matrix in a heat-dissipation composite material realized to form at least one interface between a metallic support layer and a polymer matrix, and the heat-dissipation filler includes a graphite complex in which nanoparticles serving as an anchor at the interface formed with any one or more of the metallic support layer and the polymer matrix are provided on a graphite surface.

In addition, the present invention provides an electrical/electronic part including the heat-dissipation composite material according to the present invention. According to an exemplary embodiment of the present invention, the heat-dissipation composite material may be a heat dissipation housing, a heat-dissipation support member, a thermal radiation board or a heat sink of the electrical/electronic part.

Advantageous Effects

According to the present invention, since a graphite composition has high dispersibility in a matrix, which is dissimilar to the graphite composition, a composite material realized using the graphite composition can exhibit uniform heat dissipation performance and prevent mechanical strength from deteriorating at a specific position. In addition, since the compatibility with the matrix of a different material is excellent and thus the interface property with the matrix is excellent, the realized composite material can exhibit further improved heat dissipation performance and mechanical strength. Furthermore, it is very easy to form shapes during injection/extrusion molding in combination with a matrix, and molding into complicated shapes is also possible. Since the composite material realized thereby can exhibit excellent heat dissipation performance, ensure excellent mechanical strength and is very lightweight, excellent economic feasibility and excellent durability, and exhibit long-term heat dissipation performance without a decrease in heat dissipation/mechanical strength even by physical/chemical stimuli such as external moisture or heat, it can be widely applied to various technical fields requiring heat dissipation and mechanical strength.

BRIEF DESCRIPTION OF THE DRAWINGS

FIGS. 1A-1B show diagrams of a graphite complex according to an exemplary embodiment of the present invention, wherein FIG. 1A is a perspective view of the graphite complex, and FIG. 1B is a cross-sectional view taken along line X-X' of FIG. 1A.

DETAILED DESCRIPTION

Figure 1A:
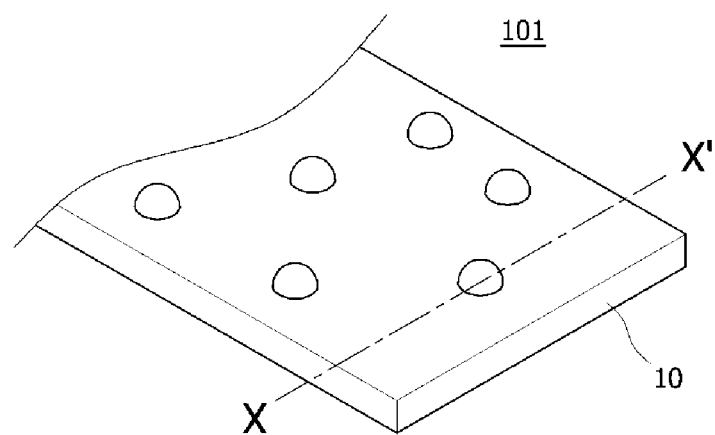

Hereinafter, embodiments of the present invention will be described in detail with reference to the accompanying drawings so that those of ordinary skill in the art can easily carry out the present invention. However, the present invention may be implemented in a variety of different forms, and is not limited to the embodiments described herein. In addition, for clear explanation of the present invention, in the drawings, parts that are not related to the description are omitted, and like numerals denote like parts throughout the specification.

First, the first exemplary embodiment of the present invention will be described.

A graphite composition according to an exemplary embodiment of the present invention includes a graphite complex having nanoparticles fixed on a graphite surface, and any one graphite of graphite flakes, spherical graphite and expanded graphite.

Figure 1B:
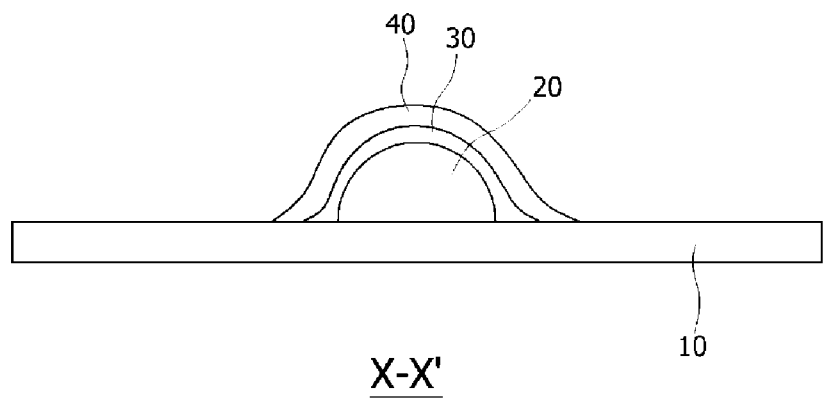

Referring to FIGS. 1A and 1B, a graphite complex 101 may include nanoparticles 20 bound on the surface of graphite 10, and may further include a catecholamine layer 30 and a polymer layer 40.

The graphite 10 is a mineral formed by overlapping layers of a planar macromolecule in which 6-element carbon rings are infinitely connected together planarly, and is known in the related art, and specifically, any one natural graphite of crystalline graphite, high crystalline graphite and amorphous graphite, or artificial graphite. When the graphite 10 is natural graphite, as an example, the graphite may be expanded graphite prepared by expanding crystalline graphite, and when a mixture of the graphite complex prepared thereby and the following graphite is used, it may be more advantageous for attaining the object of the present invention. The artificial graphite may be prepared by a known method. As an example, a thermosetting resin such as polyimide may be prepared in a film shape with a thickness of 25 μm or less, and then graphitized at a high temperature of 2,500° C. or more, thereby preparing single crystal-type graphite, or a hydrocarbon such as methane may be pyrolyzed at a high temperature and subjected to chemical vapor deposition (CVD), thereby preparing highly-oriented graphite.

In addition, the graphite 10 may have a known shape such as a spherical, plate or needle shape, or an amorphous shape, and preferably, a plate shape.

In addition, the graphite 10 may have an average particle size of 10 to 900 μm, preferably, 30 to 500 μm, and more preferably, 300 μm. When the average particle size of the graphite 10 is less than 10 μm, pores in a filtration filter are blocked in a process of washing a catecholamine component in the process of preparing a graphite complex 101, and thus it may be difficult to perform a dehydration process. In addition, the graphite 10 may be high purity graphite having a purity of 99% or more, which thus is advantageous for exhibiting more improved physical properties.

Subsequently, the nanoparticles 20 bound on the surface of the above-described graphite 10 serve as a medium which can further include a catecholamine layer 30 to be described below on the graphite 10. Specifically, since there is almost no functional group mediating a chemical reaction on the surface of the above-described graphite 10, it is difficult to include the catecholamine layer 30 that can improve dispersity of the graphite 10 in a different material on the surface of the graphite 10, and therefore, even if the graphite is treated with catecholamine, the actual amount of catecholamine remaining in graphite is very small. In addition, to solve this problem, there is a limit to the increase in the amount of catecholamine provided on the surface of modified graphite even if modification is performed to provide a functional group to the graphite surface. However, as catecholamine easily binds to the surface of nanoparticles which are provided on the graphite surface, there is an advantage in that a desired amount of catecholamine can be introduced to graphite.

In addition, a graphite composite material using a graphite composition, or nanoparticles 20 of the graphite complex 101 in a heat-dissipation composite material may serve as an anchor. That is, when there is no nanoparticle, there is a risk that a lifting part is generated due to the lack of compatibility at the interface between the outer surface of the graphite and a polymer matrix and/or support member, or lift-off at the interface between the outer surface of the graphite and a polymer matrix and/or support member, a crack of the polymer matrix, or peeling may easily occur due to vibration, impact, etc. during use.

However, since, among the nanoparticles 20 included in the graphite complex 101, nanoparticles in contact with the support member serve as an anchor at the interface between the graphite 10 and the support member, and nanoparticles in contact with the polymer matrix serve as an anchor at the interface between the graphite 10 and the polymer matrix, an inter-spacing phenomenon in which the polymer matrix lifts from the support member is prevented. Since the nanoparticles 20 of the graphite complex 101 serve as an anchor with respect to the polymer matrix, lift-off of the interface between the polymer matrix and the graphite complex 101 may also be prevented.

The nanoparticles 20 may be a metal or non-metallic material present as a solid at room temperature, and as a non-limiting example, may be selected from alkali metals, alkaline earth metals, lanthanides, actinides, transition metals, post-transition metals, metalloids, etc. in the periodic table. For example, the nanoparticles may be Ni, Si, Ti, Cr, Mn, Fe, Co, Cu, Sn, In, Pt, Au, Mg and a combination thereof, and preferably, Cu, Ni or Si.

In addition, the nanoparticles 20 may have an average particle size of 5 to 100 nm, preferably, 5 to 65 nm, and more preferably, 10 to 50 nm, and thus they may suitably serve as an anchor. If the nanoparticles have an average particle size of less than 5 nm, they may insignificantly serve as an anchor for improving an interfacial bonding property occurring between the support member and the polymer matrix. In addition, when the nanoparticles have an average particle size of more than 100 nm, the number of nanoparticles provided on the graphite surface with a limited area is reduced, and therefore it may be difficult to exhibit the interfacial bonding property at a desired level. In addition, it may difficult to prepare a particulate bound on the graphite, and there is risk that single nano powder is prepared. In addition, even when being formed on the graphite, since the nanoparticles widely cover the outer surface of the graphite, it may be difficult to form particles, and therefore, the function of the nanoparticles as an anchor may be degraded. Further, as to be described below, when the catecholamine layer is introduced, the amount of the catecholamine layer loaded in the graphite complex increases, thereby intensifying agglomeration between the graphite complexes.

Therefore, the dispersity of the graphite complex in the polymer matrix is degraded, it is difficult to exhibit a uniform heat dissipation property, and there is a risk that the durability of the part in which the graphite complex is agglomerated could be considerably reduced.

In addition, the nanoparticles 20 are present in a crystallized particle state, and preferably account for 10% or more, and more preferably, 10 to 70% of the total surface area of a single graphite 10. In addition, the nanoparticles 20 are preferably included at 3 to 50 wt %, and more preferably 3 to 20 wt %, with respect to the total weight of the graphite complex 101.

And then, the catecholamine layer 30 may be provided on the surface of the above-described nanoparticles 20, and thus excellent flowability and dispersity of the graphite in a polymer compound consisting of a material different from the graphite, which will be described below, may be exhibited, and the interfacial bonding property between the graphite complex and the polymer compound may be improved. In addition, as the catecholamine layer 30 itself has reducing power, and an amine functional group has a covalent bond with a catecholamine functional group on the layer surface by a Michael addition reaction, it is possible to perform secondary surface modification using the catecholamine layer as an adhesive material, and for example, to exhibit even more improved dispersity in the polymer compound, the polymer layer 40 may serve as a bonding material which can be introduced into the graphite.

A catecholamine, which forms the catecholamine layer 30, refers to a single molecule having a benzene ring with a hydroxyl group (—OH) as an ortho group, and various alkyl amines as a para group, and as a non-limiting example for various derivatives of such a structure, dopamine, dopamine-quinone, epinephrine, alpha-methyl dopamine, norepinephrine, alpha-methyldopa, droxidopa, indolamine, serotonin or 5-hydroxydopamine may be used, and as an example, the catecholamine layer 30 may be a dopamine layer. The dopamine is a single molecular material with a molecular weight of 153 (Da) having catechol and an amine functional group, and as an example, when a material to be surface-modified is put into an aqueous solution of a base pH condition (approximately pH 8.5) including dopamine represented by Formula 1 below and then taken out after a predetermined time, a polydopamine (pDA) coating layer may be formed on the surface of the material by oxidation of catechol.

[Formula 1]

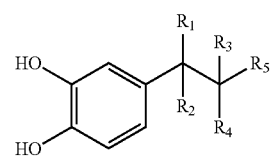

In Formula 1, at least one of $R_1$, $R_2$, $R_3$, $R_4$ and $R_5$ may be independently one type selected from the group consisting of a thiol, a primary amine, a secondary amine, a nitrile, an aldehyde, an imidazole, an azide, a halide, polyhexamethylene dithiocarbonate, hydroxyl, carboxylic acid, a carboxylic ester and a carboxamide, and the others may be hydrogen.

In addition, the thickness of the catecholamine layer 30 may be 5 to 100 nm, but the present invention is not limited thereto.

Meanwhile, a polymer layer 40 may be further applied on the catecholamine layer 30, and as the compatibility with a polymer compound forming a composite material is increased by the polymer layer 40, more improved fluidity, dispersibility and a more improved interfacial bonding property may be exhibited. The polymer layer 40 may be formed of a thermosetting polymer compound or thermoplastic polymer compound, and specific types of the thermoplastic polymer compound and the thermoplastic polymer compound may be known. As a non-limiting example, the thermosetting polymer compound may be one type of compound selected from the group consisting of an epoxy-based resin, a urethane-based resin, an ester-based resin and a polyimide-based resin, or a mixture or copolymer of two or more. The thermoplastic polymer compound may be one type of compound selected from the group consisting of polyamide, polyester, polyketone, a liquid crystal polymer, a polyolefin, polyphenylene sulfide (PPS), polyether ether ketone (PEEK), polyphenylene oxide (PPO), polyethersulfone (PES), polyetherimide (PEI) and polyimide, or a mixture or copolymer of two or more types thereof. In addition, the polymer layer may be a rubber elastomer including natural rubber and/or synthetic rubber, and an analog thereof.

In addition, when the polymer layer 40 is further included, the polymer layer may be formed to a thickness of 1 to 100 nm. In addition, the polymer layer 40 may be included at 0.01 to 20 wt % with respect to the total weight of the graphite complex.

The above-described graphite complex 101 may be prepared by preparing a graphite-nanoparticle aggregate in which nanoparticles are formed on a graphite surface and forming a catecholamine layer on the graphite-nanoparticle aggregate, and after the catecholamine layer is formed, forming a polymer layer may be further performed.

The step of preparing a graphite-nanoparticle aggregate having nanoparticles formed on a graphite surface according to an exemplary embodiment of the present invention may employ any method known to form nanoparticles on a graphite surface without limitation, and as a non-limiting example, an existing gas-phase synthesis technique of preparing metal-based nano powder may employ inert gas condensation (IGC), chemical vapor condensation (CVC), or metal salt spray-drying. However, among these, the IGC process can prepare high purity ultra-fine nano metal powder, needs high energy and has a very low production speed, and thus has a limit to industrial application, and the CVC process may be slightly improved in energy or production speed, compared to the IGC process, but it can be uneconomical due to the high price of the precursor, which is a raw material. In addition, the metal salt spray-drying process is economical because it uses an inexpensive salt as a raw material, but since contamination and the agglomeration of powder at a drying step are unavoidable, and a toxic byproduct is generated, the metal salt spray-drying process is disadvantageous in an environmental aspect.

Preferably, the nanoparticles are formed on the graphite by atmospheric pressure radio-frequency thermal plasma. Specifically, this step may be carried out by mixing graphite with nanoparticle-forming powder; injecting a gas into the prepared mixture; vaporizing the nanoparticle-forming powder by radio-frequency thermal plasma; and crystallizing the vaporized nanoparticle-forming material on the graphite surface.

First, in the step of mixing graphite and nanoparticle-forming powder, a mixing ratio between these two materials may be designed differently according to purpose, but preferably, to include nanoparticles at a high density, the nanoparticle-forming material is mixed at 3 to 100 parts by weight with respect to 100 parts by weight of the graphite. Here, these materials may be mixed using a separate stirrer.

Afterward, a gas may be injected into the mixture, and the gas injected herein may be classified into sheath gas, central gas or carrier gas according to the function thereof, and may be an inert gas such as argon, hydrogen, nitrogen or a mixed gas thereof, and preferably, argon gas. The sheath gas is injected to prevent attachment of vaporized nanoparticles onto the inner surface of a wall and protect the wall surface from ultra high-temperature plasma, and may be argon gas injected at 30 to 80 liters per minute (lpm). In addition, the central gas is a gas injected to produce high-temperature thermal plasma, and as the central gas, 30 to 70 lpm of argon gas may be used. In addition, the carrier gas is a gas serving to supply a mixture into a plasma reactor, and may be 5 to 15 lpm of argon gas.

Subsequently, the nanoparticle-forming material may be vaporized by radio-frequency thermal plasma. The thermal plasma is an ionization gas composed of electrons, ions, atoms and molecules, generated from a plasma torch using direct current arc or radio-frequency inductively coupled discharge, and a high-speed jet with a super high temperature ranging from thousands to tens of thousands of K and high activity. Accordingly, to actively generate high temperature plasma, 10 to 70 kW of electric power is provided to a power supply of the plasma device, an arc is formed by electric energy, and ultra-high temperature plasma of approximately 10,000K is generated by argon gas used as a thermal plasma generator. As described above, the ultra-high-temperature thermal plasma generated using argon gas as a generated gas while the power is maintained to 10 to 70 kW is generated at a higher temperature than thermal plasma generated by thermal treatment or combustion. Here, the present invention may use a known radio-frequency thermal plasma (RF) method by being suitably modified, or may use an existing thermal plasma processing device.

And then, the step of crystalizing the vaporized nanoparticle-forming material on the graphite surface may be performed. To crystalize the vaporized nanoparticle-forming material on the graphite surface, a quenching gas may be used. Here, the vaporized nanoparticle-forming material may be crystallized by performing condensing or rapidly cooling with the quenching gas to inhibit the growth of nanoparticles.

The step of forming a catecholamine layer on the graphite-nanoparticle aggregate prepared by the above-described method may be carried by, specifically, dipping the graphite-nanoparticle aggregate in a weakly basic dopamine aqueous solution; and forming a polydopamine layer on the surface of the graphite-nanoparticle aggregate.

First, a method of preparing the weakly basic dopamine aqueous solution is not particularly limited, and the weakly basic dopamine aqueous solution may be prepared by dissolving dopamine in a base Tris buffer solution at pH 8 to 14 (10 mM, Tris buffer solution), and preferably, by dissolving dopamine in a base Tris buffer solution at pH 8.5 under the same base condition as the undersea environment. Here, the concentration of the weakly basic dopamine aqueous solution may be 0.1 to 5 mg/mL, and preferably, 2 mg/mL.

The catecholamine layer, which is a polydopamine layer, may be formed on the graphite-nanoparticle aggregate by dipping the graphite-nanoparticle aggregate in the prepared weakly basic dopamine aqueous solution and undergoing spontaneous polymerization of dopamine under basic and oxidizing conditions. Here, the polydopamine layer may be formed by further including an oxidizing agent, and oxygen gas in the air may be used as an oxidizing agent without a separate oxidizing agent, but the present invention is not particularly limited thereto.

Here, a dipping time determines the thickness of the polydopamine layer, and when a dopamine aqueous solution having pH 8 to 14 and a dopamine concentration of 0.1 to 5 mg/mL is used, dipping is preferably performed for approximately 0.5 to 24 hours to form the catecholamine layer to a thickness of 5 to 100 nm. In the case of pure plate-shaped graphite, a dopamine coating layer may be hardly formed on a graphite surface by the above-described method, but a catecholamine layer may be formed on nanoparticles due to the nanoparticles. Meanwhile, dipping is used as the above-described method of forming a polymer layer, but the present invention is not limited thereto, and a polymer layer may be further formed by a known method such as blade coating, flow coating, casting, printing, transferring, brushing, or spraying.

Meanwhile, to further provide a polymer layer to a graphite complex having a catecholamine layer, a graphite complex having a polymer layer may be prepared by mechanically mixing a graphite complex into a solution in which a desired polymer compound is dissolved or melted.

Next, graphite mixed with the above-described graphite complex 101 will be described.

The graphite serves to inhibit secondary agglomeration of the above-described graphite complexes 101 to allow the graphite complex to be more easily dispersed in a polymer compound, and to embody a lighter composite material. When the above-described graphite complex is mixed with the polymer compound, to improve fluidity, dispersibility and an interfacial bonding property, a catecholamine layer may be included, but since secondary agglomeration between graphite complexes may even occur due to the catecholamine layer, the dispersibility of the graphite composition in the prepared composite material may be degraded. The graphite prevents the secondary agglomeration between the graphite complexes, thereby exhibiting uniform physical properties by area of the prepared composite material and preventing the decrease in mechanical strength due to agglomeration.

The graphite may include any one or more of graphite flakes (expandable graphite flakes), expanded graphite and spherical graphite, and therefore, the prepared graphite composite material may exhibit a different effect or more improved physical property. The spherical graphite may be prepared in a spherical shape, for example, by grinding graphite flakes.

The graphite flake and expanded graphite may exhibit heat dissipation performance which is more improved when mixed with the graphite complex, and particularly, improved horizontal thermal conductivity, and while being dispersed in the polymer matrix, excellent mechanical strength may be exhibited. In addition, the spherical graphite may complement the vertical thermal conductivity of a graphite composite material. The graphite has excellent thermal conductivity and electrical conductivity in a horizontal direction, but is poor in such physical properties in a vertical direction. This is because the migration of free charge is possible in a horizontal direction, like a metallic bond, but not in the vertical direction. For this reason, the composite material prepared by including general graphite has a disadvantage in that a heat dissipation effect in a vertical direction is insignificant due to the difference between the horizontal thermal conductivity and the vertical thermal conductivity. However, in the case of the spherical graphite, by remedying such a disadvantage, thermal conductivity in a vertical direction may be improved.

The graphite flake preferably has an average particle size of 10 to 1,000 μm, and more preferably, 50 to 500 μm. In addition, the expanded graphite preferably has an average particle size of 50 to 1,000 μm, and more preferably, 100 to 500 μm. In addition, the spherical graphite preferably has an average particle size of 10 to 100 μm, and more preferably, 20 to 40 μm. When the average particle size of graphite by type satisfies the above numerical range, it may be very advantageous for inhibiting the above-described agglomeration of the graphite complexes, in addition for the improvement in thermal conductivity. In addition, graphite release from a generated pellet, graphite composite material or heat-dissipation composite material, which may occur as the particle size is very small may be inhibited. In addition, the degradation of fluidity of graphite in a melted polymer compound generated when graphite exceeding the upper limit of the preferable particle size range by type, or the decrease in surface quality in a graphite composite material or heat-dissipation composite material may be prevented.

Meanwhile, when the average particle size of the graphite is smaller than that of the above-described graphite complex 101, linkage between some of graphite may occur. In this case, close packing in a polymer matrix is possible using the bimodality of a large particle and a small particle, and thermal conductivity may be more improved.

In addition, graphite including any one or more of the graphite flake, expanded graphite and spherical graphite is preferably included at weight ratio of 1:1 to 25, more preferably, 1:1 to 15, and even more preferably, 1:1 to 10 with respect to the weight of the graphite complex. When the graphite is included at less than a 1:1 weight ratio with respect to the weight of the graphite complex, a degree of improving heat dissipation performance due to the graphite is insignificant, it may be difficult to prevent the agglomeration of the graphite complexes. In addition, since most of a heat-dissipation filler is prepared of a graphite complex, there is a risk of cost increase, and it may be undesirable for preparation of a lightweight composite material. On the other hand, when the graphite is included at more than a 1:25 weight ratio with respect to the weight of the graphite complex, a reduction in the heat dissipation property of the prepared composite material may occur, and since, particularly, in the process of preparing a composite material, heat-dissipation filler fluidity may be reduced and thus concentrated in the center rather than on the surface of the composite material, the heat radiation property and vertical thermal conduction performance of conducted heat may be significantly reduced. In addition, due to the degradation in an interfacial bonding property between different materials, spacing at the interface between the polymer matrix and the graphite and the interface between the polymer matrix and the support member may occur more frequently and severely.

Meanwhile, according to an exemplary embodiment of the present invention, the graphite included with the graphite complex 101 may be expanded graphite, and therefore, compared to different types of graphite, types of mechanical strength such as tensile strength, flexural rigidity, flexural modulus and impact strength and horizontal thermal conductivity may be achieved at high levels.

In addition, according to an exemplary embodiment of the present invention, the graphite included with the graphite complex 101 may be graphite flakes and expanded graphite. In this case, particularly compared to the case including either of expanded graphite or graphite flakes, it may be very advantageous for achievement of increased horizontal thermal conductivity as well as excellent tensile strength. More preferably, the expanded graphite and the graphite flake is included at a weight ratio of 1:1 to 20, and even more preferably, 1:1 to 13. When the graphite flake is included at a weight ratio of less than 1:1 with respect to the weight of the expanded graphite, due to a reduction in fluidity while the graphite flake is mixed with the melted polymer compound, it may be difficult to achieve injection molding, which means that it may be difficult to achieve the object of the present invention. In addition, when the graphite flake is included at more than 1:25 weight ratio with respect to the weight of the expanded graphite, it may be difficult to achieve increased horizontal thermal conductivity. In addition, there is a risk that types of mechanical strength such as tensile strength, flexural modulus, impact strength, etc. will be reduced The graphite composition including the above-described graphite complex and graphite is embodied as a masterbatch for preparing a graphite composite material with a thermoplastic polymer compound.

The graphite complex and graphite are included at preferably 20 to 80 wt %, and more preferably, 30 to 70 wt % with respect to the total weight of the masterbatch, and when the graphite complex and graphite are included at preferably less than 20 wt %, physical properties such as thermal conductivity of the graphite composite material prepared using the masterbatch may be reduced. In addition, when the graphite complex and graphite are included at more than 80 wt %, it may be difficult to prepare a masterbatch, and storage stability may be poor because of serious cracking and destruction of the prepared masterbatch. Accordingly, the implemented composite material may also be considerably reduced in mechanical strength.

The thermoplastic polymer compound may be a known thermoplastic polymer compound, and may be a material for forming a polymer matrix of the graphite composite material, which will be described below. The thermoplastic polymer compound may be one type of compound selected from the group consisting of polyamide, polyester, polyketone, a liquid crystal polymer, polyolefin, polyphenylene sulfide (PPS), polyether ether ketone (PEEK), polyphenylene oxide (PPO), polyethersulfone (PES), an acrylonitrile-butadiene-styrene (ABS) copolymer, polyetherimide (PEI) and polyimide, or a mixture or copolymer of two or more thereof.

For example, the polyamide may be a known polyamide-based compound such as nylon 6, nylon 66, nylon 11, nylon 610, nylon 12, nylon 46, nylon 9T (PA-9T), Qiana or aramid.

For example, the polyester may be a known polyester-based compound such as polyethylene terephthalate (PET), polytrimethylene terephthalate (PTT), polybutylene terephthalate (PBT) or polycarbonate.

For example, the polyolefin may be a known polyolefin-based compound such as polyethylene, polypropylene, polystyrene, polyisobutylene or ethylene vinyl alcohol.

The liquid crystal polymer may be a polymer exhibiting liquid crystallinity in a solution or dissolution state without limitation, and may be a known type, and therefore, the present invention is not particularly limited thereto.

Meanwhile, the masterbatch for preparing a graphite composite material may further include additives such as a strength modifier, an impact modifier, an antioxidant, a thermal stabilizer, a light stabilizer, a plasticizer, a dispersing agent, a work modifier, a coupling agent, a UV absorber, an antistatic agent, a flame retardant, etc.

As the strength modifier, any one of known components that can improve a composite material between a heat dissipation filler including a graphite complex and graphite and a polymer compound may be used without limitation, and as a non-limiting example of the strength modifier, one or more types of components selected from the group consisting of a carbon fiber, a glass fiber, glass beads, zirconium oxide, wollastonite, gibbsite, boehmite, magnesium aluminate, dolomite, calcium carbonate, magnesium carbonate, mica, talc, silicon carbide, kaolin, calcium sulfate, barium sulfate, silicon dioxide, ammonium hydroxide, magnesium hydroxide and aluminum hydroxide may be included. The strength modifier may be included at 0.1 to 30 parts by weight with respect to 100 parts by weight of the above-described graphite composition, but the present invention is not limited thereto. As an example, when a glass fiber is used as the strength modifier, the glass fiber may have a length of 2 to 8 mm.

In addition, as the impact modifier, any one of known components that can improve impact resistance by exhibiting flexibility and stress relaxation of a composite material of the graphite complex/graphite and a polymer compound may be used without limitation, and as an example, one or more components such as thermoplastic polyurethane (TPU), thermoplastic polyolefin (TPO), maleic acid-grafted EPDM, elastic particles having a core/shell structure and a rubber-based resin may be included as the impact modifier. The thermoplastic polyolefin is a rubber-like material group, and may be a linear polyolefin block copolymer having a polyolefin block such as polypropylene or polyethylene and a rubber block or a blend of polypropylene and an ethylene-propylene-diene monomer (EPDM), which is an ethylene-based elastomer. Specific thermoplastic polyolefins may be known, and therefore, in the present invention, the description of specific types thereof will be omitted. Since the thermoplastic polyurethanes may also be known, the description of specific types thereof will be omitted. In addition, in the elastic particles having a core/shell structure, the core may be an allyl-based resin, and the shell part may be a polymer resin having a functional group that can be reacted to increase compatibility and bonding strength with the thermoplastic polymer compound.

In addition, the impact modifier may be included at 0.1 to 30 parts by weight with respect to 100 parts by weight of the total weight of the graphite composition, but the present invention is not limited thereto.

In addition, the antioxidant is included to prevent breaking of the main chain of the thermoplastic polymer compound by inhibiting radical generation due to heat and/or shear during extrusion or injection, and prevent discoloration due to heat generated in secondary processing. As the antioxidant, a known antioxidant may be used without limitation, and non-limiting examples of the antioxidant may include an organophosphite such as tris(nonylphenyl) phosphite, tris(2,4-di-t-butylphenyl)phosphite, bis(2,4-di-t-butylphenyl)pentaerythritol diphosphite, distearyl pentaerythritol diphosphite or the like; an alkylated monophenol or polyphenol; an alkylated reaction product of polyphenol with a diene, such as tetrakis[methylene(3,5-di-tert-butyl-4-hydroxyhydrocinnmate)]methane or the like; a butylated reaction product of para-cresol or dicyclopentadiene; alkylated hydroquinone; hydroxylated thiodiphenyl ether; alkylidene-bisphenol; a benzyl compound; an ester of beta-(3,5-di-tert-butyl-4-hydroxyphenyl)-propionic acid with a monohydric or polyhydric alcohol; an ester of beta-(5-tert-butyl-4-hydroxy-3-methylphenyl)-propionic acid with a monohydric or polyhydric alcohol; an ester of a thioalkyl or thioaryl compound such as distearylthiopropionate, dilaurylthiopropionate, ditridecylthiodipropionate, octadecyl-3-(3,5-di-tert-butyl-4-hydroxyphenyl)propionate, pentaerythrityl-tetrakis[3-(3,5-di-tert-butyl-hydroxyphenyl)propionate or the like; an amide of beta-(3,5-di-tert-butyl-4-hydroxyphenyl)-propionic acid or the like, and a mixture thereof. The antioxidant may be included at 0.01 to 0.5 parts by weight with respect to 100 parts by weight of the thermoplastic polymer compound.

In addition, the thermal stabilizer may be any one of known thermal stabilizers without limitation, and non-limiting examples of the thermal stabilizer include an organophosphite such as triphenyl phosphite, tris-(2,6-dimethylphenyl)phosphite, tris-(mixed mono- and di-nonylphenyl) phosphite or the like; a phosphonate such as dimethylbenzene phosphonate or the like; a phosphate such as trimethyl phosphate or the like; and a mixture thereof. The thermal stabilizer may be included at 0.01 to 0.5 parts by weight with respect to 100 parts by weight of the thermoplastic polymer compound.

In addition, the light stabilizer may be any one of known light stabilizers without limitation, and non-limiting examples of the light stabilizer may include a benzotriazole such as 2-(2-hydroxy-5-methylphenyl)benzotriazole, 2-(2-hydroxy-5-tert-octylphenyl)-benzotriazole, 2-hydroxy-4-n-octoxy benzophenone, or the like, and a mixture thereof. The light stabilizer may be included at 0.1 to 1.0 parts by weight with respect to 100 parts by weight of the thermoplastic polymer compound.

In addition, the plasticizer may be any one of known plasticizers without limitation, and non-limiting examples of the plasticizer may include a phthalic acid ester such as dioctyl-4,5-epoxy-hexahydrophthalate, tris-(octoxycarbonylethyl)isocyanurate, tristearin, epoxidized soybean oil or the like, and a mixture thereof. The plasticizer may be included at 0.5 to 3.0 parts by weight with respect to 100 parts by weight of the thermoplastic polymer compound.

In addition, the antistatic agent may be any one of known antistatic agents without limitation, and non-limiting examples of the antistatic agent include glycerol monostearate, sodium stearyl sulfonate, sodium dodecylbenzenesulfonate, polyether block amide or a mixture thereof. These may be commercially obtained from, for example, Irgastat® of BASF; PEBAX® of Arkema; and Pelestat® of Sanyo Chemical industries. The antistatic agent may be included at 0.1 to 2.0 parts by weight with respect to 100 parts by weight of the thermoplastic polymer compound.

In addition, the work modifier may be any one of known working modifiers without limitation, and non-limiting examples of the work modifier may include a metal stearate, stearyl stearate, pentaerythritol tetrastearate, beeswax, montan wax, paraffin wax, polyethylene wax or the like, and a mixture thereof. The work modifier may be included at 0.1 to 1.0 parts by weight with respect to 100 parts by weight of the thermoplastic polymer compound.

In addition, the UV absorbent may be any one of known UV absorbents without limitation, and non-limiting examples of the UV absorbent include hydroxybenzophenones; hydroxybenzotriazoles; hydroxybenzotriazines; cyanoacrylates; oxanilides; benzoxazinones; 2-(2H-benzotriazol-2-yl)-4-(1,1,3,3-tetramethylbutyl)-phenol; 2-hydroxy-4-n-octyloxybenzophenone; 2-[4,6-bis(2,4-dimethylphenyl)-1,3,5-triazin-2-yl]-5-(octyloxy)-phenol; 2,2'-1,4-phenylene)bis(4H-3,1-benzoxazin-4-one); 1,3-bis[(2-cyano-3,3-diphenylacryloyl)oxy]-2,2-bis[[(2-cyano-3,3-diphenylacryloyl)oxy]methyl]propane; 2,2'-(1,4-phenylene) bis(4H-3,1-benzoxazin-4-one); 1,3-bis[(2-cyano-3,3-diphenylacryloyl)oxy]-2,2-bis[[(2-cyano-3,3-diphenylacryloyl)oxy]methyl]propane; nano-scale inorganic materials such as titanium oxide, cerium oxide and zinc oxide, all of which have a particle size of less than 100 nm; an analog thereof, and a mixture thereof. The UV absorbent may be included at 0.01 to 3.0 parts by weight with respect to 100 parts by weight of the thermoplastic polymer compound.

In addition, the dispersing agent may employ any one of known components as a dispersing agent of a carbon-based heat-dissipation filler without limitation. As a non-limiting example of the dispersing agent may be a polyester-based dispersing agent, a polyphenylene ether-based dispersing agent, a polyolefin-based dispersing agent, an acrylonitrile-butadiene-styrene copolymer dispersing agent, a polyacrylate-based dispersing agent, a polyamide-based dispersing agent, a polyamideimide-based dispersing agent, a polyacrylsulfone-based dispersing agent, a polyetherimide-based dispersing agent, a polyethersulfone-based dispersing agent, a polyphenylene sulfide-based dispersing agent, a polyimide-based dispersing agent; a polyetherketone-based dispersing agent, a polybenzoxazole-based dispersing agent, a polyoxadiazole-based dispersing agent, a polybenzothiazole-based dispersing agent, a polybenzimidazole-based dispersing agent, a polypyridine-based dispersing agent, a polytriazole-based dispersing agent, a polypyrrolidine-based dispersing agent, a polydibenzofuran-based dispersing agent, a polysulfone-based dispersing agent, a polyurea-based dispersing agent, a polyurethane-based dispersing agent, or a polyphosphazene-based dispersing agent, which may be used alone or a mixture or copolymer of two or more selected therefrom.

The dispersing agent may be included at 0.2 to 6.0 parts by weight with respect to 100 parts by weight of the graphite composition.

In addition, the coupling agent may be a known coupling agent without limitation, and as a non-limiting example of the coupling agent, one or more selected from the group consisting of a silane-based coupling agent, an amine-based coupling agent, maleic acid-grafted polypropylene (MAH-g-PP) and maleic acid-grafted EPDM (MAH-g-EPDM) may be used. In addition, the coupling agent may be included at 0.01 to 8.0 parts by weight with respect to 100 parts by weight of the thermoplastic polymer compound.

In addition, the flame retardant may be, for example, a halogenated flame retardant, a like tetrabromo bisphenol A oligomer such as BC58 or BC52, brominated polystyrene or poly(dibromo-styrene), brominated epoxy, decabromophenyleneoxide, a pentabromophenyl acrylate monomer, a pentabromobenzyl acrylate polymer, ethylene-bis(tetrabromophthalimide, bis(pentabromobenzyl)ethane, a metal hydroxide such as $Mg(OH)_2$ or $Al(OH)_3$, melamine cyanurate, a phosphor-based FR system such as red phosphorus, melamine polyphosphate, phosphate ester, a metal phosphinate, ammonium polyphosphate, expandable graphite, sodium or potassium perfluorobutane sulfate, sodium or potassium perfluorooctane, sodium or potassium diphenyl sulfone sulfonate and sodium or potassium-2,4,6,-trichlorobenzonate and N-(p-tolylsulfonyl)-p-toluenesulfimide potassium salt, N—(N'-benzylaminocarbonyl) sulfanilimide potassium salt, or a mixture thereof, but the present invention is not limited thereto. The flame retardant may be included at approximately 30 parts by weight with respect to 100 parts by weight of the graphite composition.

The above-described process of preparing a masterbatch including the graphite composition, thermoplastic polymer compound and other additives may be a conventionally known method, and for example, the prepared masterbatch may be a pellet type. Since it may be prepared by a conventional method of preparing a pellet, in the present invention, detailed description will be omitted.

Next, a graphite composite material according to an exemplary embodiment of the present invention will be described.

Figure 2:
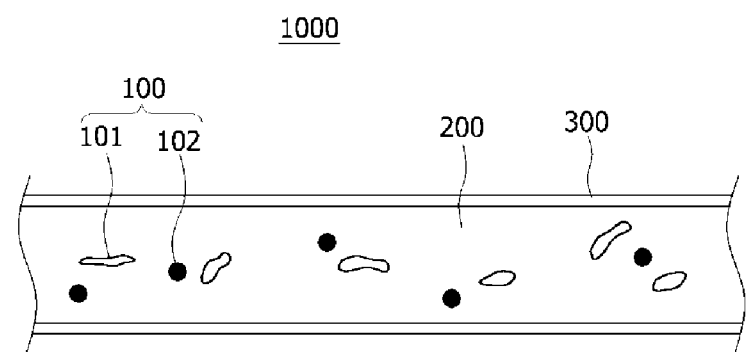
FIGS. 2 to 5 show cross-sectional views of a graphite composite material according to various exemplary embodiments of the present invention.
Figure 3:
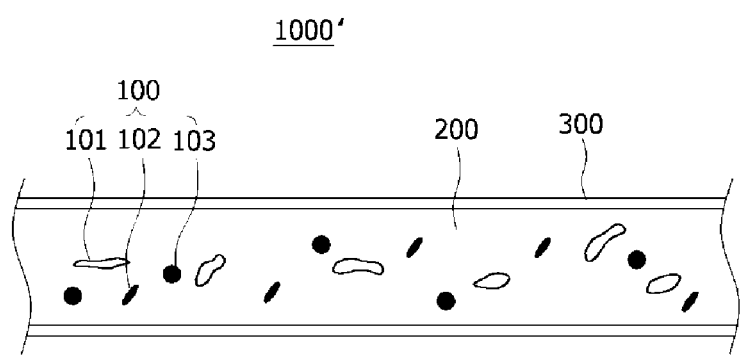

As shown in FIGS. 2 and 3, graphite composite materials 1000 and 1000' may include a polymer matrix 200 molded of a thermoplastic polymer compound and a heat-dissipation filler 100 consisting of a graphite composition according to the present invention including a graphite complex 101 and graphite 102 and 103, which are dispersed in the polymer matrix, and may further include a protective coating layer 300 on the outer surface of the polymer matrix 200.

FIG. 2 or 3 illustrates that the graphite complex 101 and the graphite 102 and 103 in the heat-dissipation filler 100 are dispersed only in the polymer matrix 200, but may be disposed to be exposed at the outer surface thereof.

The graphite 102 and 103 may include any one or more of graphite flakes, spherical graphite and expanded graphite, and as shown in FIG. 2, the heat-dissipation filler 100 may include one type of graphite 102, for example, expanded graphite. In addition, as shown in FIG. 3, the heat-dissipation filler 100 may include two types of graphite 102 and 103, for example, graphite flakes and spherical graphite, and therefore, it may be advantageous for simultaneously exhibiting improved vertical thermal conductivity and horizontal thermal conductivity. Alternatively, a combination of two types of graphite, including expanded graphite and graphite flakes, may be included, and therefore, as described above, the composite material may exhibit excellent mechanical strength and increased horizontal thermal conductivity.

The heat-dissipation filler including the graphite complex 101 and the graphite 102 and 103 is preferably included at 10 to 90 wt %, more preferably 20 to 80 wt %, and even more preferably 30 to 70 wt % with respect to the total weight of the graphite composite material 1000. When the heat-dissipation filler is included at less than 10 wt %, desired heat dissipation performance and shielding performance may not be exhibited. In addition, when the heat-dissipation filler is included at more than 90 wt %, the mechanical strength of the composite material may be significantly reduced, moldability in injection molding may be reduced, and it may be difficult to embody the composite material in a complicated shape.

There is no limit in shape and size of the polymer matrix 200. For example, the polymer matrix may be a sheet type.

Meanwhile, the protective coating layer 300 serves to protect the polymer matrix 200 from external physical/chemical stimuli, and prevent the release of the graphite complex 101 or the graphite 102 and 103, which are included in the polymer matrix 200. In addition, when the protective coating layer 300 is formed of an insulating material, an insulation property required for a heat dissipation member of an electronic device may be provided.

The protective coating layer 300 may be formed of a known thermosetting polymer compound or thermoplastic polymer compound. The thermoplastic polymer compound may be one type of compound selected from the group consisting of epoxy-, ester- and polyimide-based resins, or a mixture or copolymer of two or more thereof. In addition, the thermoplastic polymer compound may be one compound selected from the group consisting of polyamide, polyester, polyketone, a liquid crystal polymer, polyolefin, polyphenylene sulfide (PPS), polyether ether ketone (PEEK), polyphenylene oxide (PPO), polyethersulfone (PES), polyetherimide (PEI) and polyimide, or a mixture or copolymer of two or more thereof, but the present invention is not limited thereto.

The protective coating layer 300 may have a thickness of 0.1 to 1000 μm, but the present invention is not limited thereto, and may be embodied to have a different thickness according to purpose.

Meanwhile, the protective coating layer 300 may further include known metal-, carbon- and/or ceramic-based heat-dissipation filler(s) to exhibit more improved heat dissipation and radiation of heat to outside air. In addition, when an insulation property is also required, a known insulating heat-dissipation filler such as aluminum oxide, boron nitride, talc, magnesium oxide or silicon carbide may be included. When the protective coating layer 300 is a heat-dissipation coating layer, it may have a thickness of 10 to 50 μm, and when the thickness is more than 50 μm, radiation may rather be significantly reduced.

In addition, the protective coating layer 300 may include a pigment. As the graphite composite material 1000 or 1000' is a heat-dissipation filler, since graphite is included as a main component, the graphite composite material may be embodied in a dark or almost black color, and in this case, because of color issues, the use of the graphite composite material may be avoided in some applications. Therefore, the protective coating layer 300 may further include a known pigment expressing a desired color.

However, when the protective coating layer 300 has a small thickness, in spite of the added pigment, a desired color may not be expressed.

Figure 4:
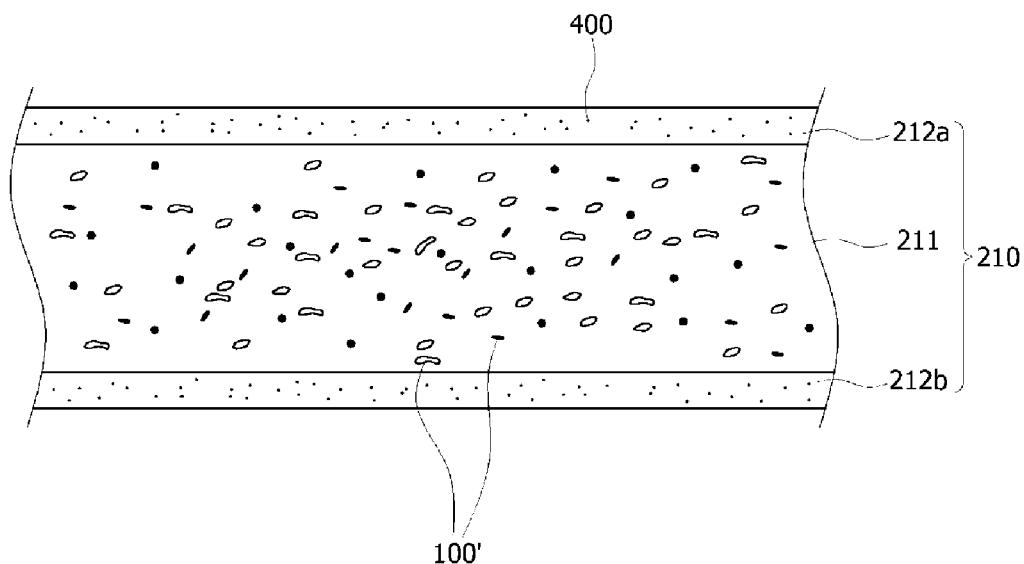
Figure 5:
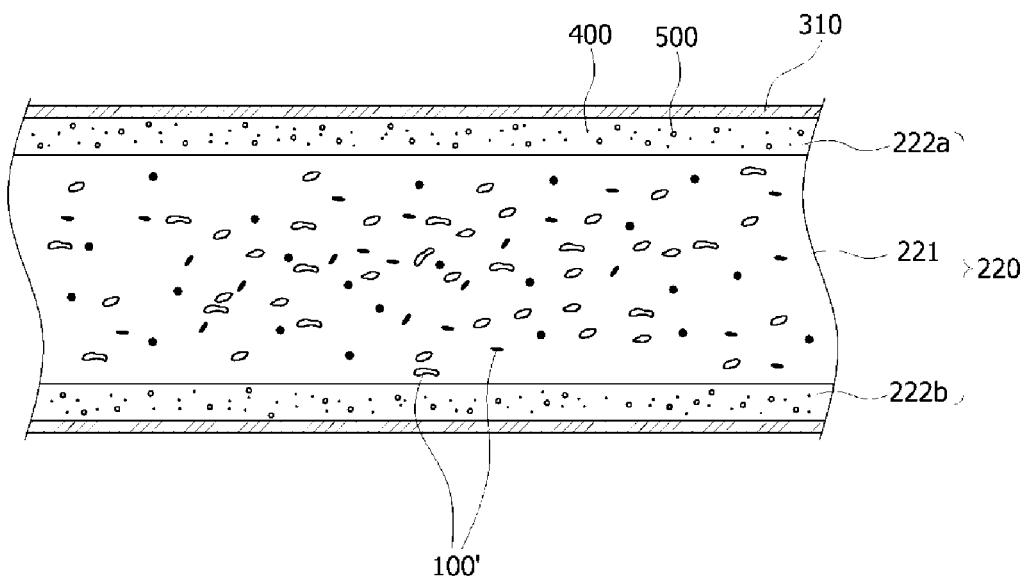

According to another exemplary embodiment of the present invention, as shown in FIGS. 4 and 5, a graphite composite material 2000 or 2000' may consist of a polymer matrix 210 or 220 including a core part 211 or 221 and coating parts 212a/212b or 222a/222b, which surround the core part 211 or 221, respectively, and may include a first heat dissipating filler 100' in the core part 211 or 221, and a pigment 400 in the coating parts 212a/212b or 222a/222b, such that a desired color different from the color of the core part may be expressed.

The description of the first heat dissipating filler 100' is omitted since it is the same as described for the above-described heat-dissipation filler 100.

In addition, the core part 211 or 221 and the coating parts 212a/212b or 222a/222b are molded to include a thermoplastic polymer compound, and for example, may be embodied through double injection molding. Specifically, first, after a core part is injected-molded into a predetermined shape, coating parts are injected-molded to surround the outside of the manufactured core part so as to embody a polymer matrix. However, the present invention is not limited thereto, and a polymer matrix may be embodied by simultaneously injection-molding a core part and coating parts. Here, thermoplastic polymer compounds that form the core part 211 or 221 and the coating parts 212a/212b or 222a/222b may be the same or different from each other, and may vary according to purpose.

In addition, the coating parts 212a/212b or 222a/222b preferably have a thickness of 300 μm to 1 cm to prevent the color of the core part 211 or 221 showing through, but the present invention is not limited thereto. The color of the core part may be changed in consideration of chroma/brightness, the type of a material of the coating part, and the content of the included pigment.

Since the content of the pigment 400 may vary according to the type and variation of color to be expressed, the present invention is not particularly limited thereto.

Meanwhile, when the coating parts 212a/212b or 222a/222b have a large thickness, the heat dissipation or radiation of the core part 211 or 221 may be inhibited, and therefore, preferably, a second heat dissipating filler 500 is further included to minimize the reduction in heat dissipation and radiation of the coating parts 212a/212b or 222a/222b. The second heat dissipating filler 500 may be a known heat-dissipation filler, and may further include, for example, known metal-, carbon- and/or ceramic-based heat-dissipation filler(s). In addition, when an insulation property is also required, a known insulating heat-dissipation filler such as aluminum oxide, boron nitride, talc, magnesium oxide, or silicon carbide may be included. In addition, since the content of the second heat dissipating filler 500 may be suitably changed in consideration of the content of a pigment in the coating part, the thickness of the coating part, and the type of a main material resin forming a coating part, the present invention is not particularly limited thereto.

In addition, as shown in FIG. 5, to prevent the pigment 400 or the second heat-dissipation filler 500 from being released to the outside of the coating parts 212a/212b or 222a/222b, a protective coating layer 310 may be further included. The protective coating layer 310 is the same as described for the above-described protective coating layer 300, and thus the detailed description thereof will be omitted.

Meanwhile, the above-described graphite composite material may be embodied as a heat-dissipation composite material with a support member. Since the graphite composite material may exhibit excellent heat dissipation and be lightweight, in some applications, the use of the graphite composite material may be restricted when a high level of mechanical strength is also required. When the support member that can complement the mechanical strength is also included, it has the advantage of simultaneous achievement of heat dissipation and mechanical strength.

The support member improves the mechanical strength of the heat-dissipation composite material and exhibits predetermined heat dissipation performance. The support member may be formed of any material which is not easily spaced apart from the interface between the polymer matrix and the support member due to excellent compatibility with the above-described polymer matrix, has high mechanical strength even with a small thickness, and has predetermined thermal conductivity as long as there is thermal resistance enough to be injection-molded without limitation. As a non-limiting example of the material, the support member may be formed of a known material such as a polymer compound, a ceramic or a metal, and for example, to improve thermal conductivity, the material is preferably a metal. However, when the support member is formed of a material different from the polymer matrix, the bonding property at the interface may degraded, and in this case, the polymer matrix may easily peel off from the support member or have a crack. In addition, cracking or peeling may cause the penetration of impurities such as moisture into a relevant part, resulting in a further reduction in durability.

The second exemplary embodiment of the present invention is for improving the interfacial bonding property of a heat-dissipation composite material prepared such that a graphite composite material is prepared to form the interface between a polymer compound and a support member of a material different from the polymer compound, particularly, a metallic support member, to complement the mechanical strength, which will be described in detail as follows.

Referring to FIGS. 6 to 9, a heat-dissipation composite material 3000, 3001, 3002 or 3003 according to an exemplary embodiment of the present invention includes a polymer matrix 200, a metallic support layer 600, 601, 602 or 603 forming at least one interface with the polymer matrix 200, and a heat-dissipation filler 100 including a graphite complex 101 and dispersed in the polymer matrix 200, respectively.

The polymer matrix 200 receives heat extracted from the metallic support layer 600, 601, 602 or 603 or an external heat source and/or radiate the heat to the outside. The polymer matrix 200 is the body of the heat-dissipation composite material, and there is no limit as long as the polymer matrix is embodied as a polymer compound which has high compatibility with a heat-dissipation filler 100 to be described below and the metallic support layer 600, 601, 602 or 603, does not inhibit the dispersion of the heat-dissipation filler 100, and is preferably capable of being subjected to injection molding. The polymer matrix 200 is the same as the polymer matrix in the graphite composite member described in the first exemplary embodiment, and the detailed description thereof will be omitted.

As a support member, the metallic support layer 600, 601, 602 or 603 is a layer improving the mechanical strength of the heat-dissipation composite material 3000, 3001, 3002 or 3003 and exhibiting predetermined heat dissipation performance. The metallic support layer 600, 601, 602 or 603 may be any metallic material which has excellent compatibility with the above-described polymer matrix, is not easily spaced apart from the interface between the polymer matrix and the metallic support layer, has excellent mechanical strength even with a small thickness, and has predetermined thermal conductivity as well as sufficient thermal resistance for injection molding without limitation. As a non-limiting example of the material, the metallic support layer 600, 601, 602 or 603 may be one type of metal selected from the group consisting of aluminum, magnesium, iron, titanium and copper or an alloy including at least one type of metal thereof.

In addition, the thickness of the metallic support layer 600, 601, 602 or 603 is preferably 0.5 to 90%, and more preferably, 3 to 50% of the total thickness of the heat-dissipation composite material 3000, 3001, 3002 or 3003. When the thickness of the metallic support layer 600, 601, 602 or 603 is less than 0.5% of the total thickness of the heat-dissipation composite material 3000, 3001, 3002 or 3003, it is difficult to ensure a desired level of mechanical strength and heat dissipation performance. In addition, when the thickness is more than 90%, it is difficult to exhibit a desired level of heat dissipation performance, and moldability into a complicated shape may be reduced. However, the thickness of the metallic support layer 600, 601, 602 or 603 is not limited to the above-mentioned range, and may be suitably changed in consideration of the mechanical strength required for the heat-dissipation composite material 3000, 3001, 3002 or 3003.

In addition, the metallic support layer 600, 601, 602 or 603 may be formed in a plate shape with a predetermined width, or formed in various structures including a parallel structure, a lattice structure, a honeycomb structure and a combination thereof by spacing a plurality of wires or bars a predetermined distance apart from each other inside an edge member having a predetermined shape such as a square or circular shape.

Figure 6:
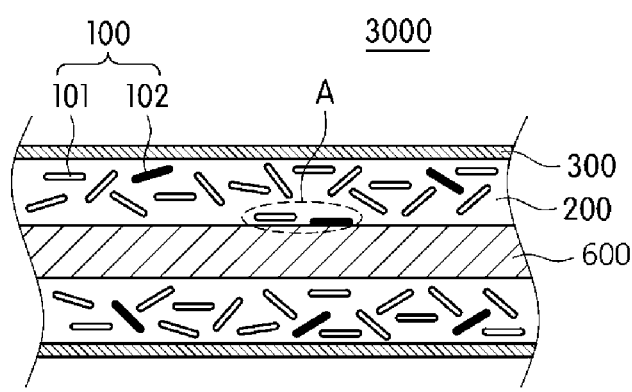
FIGS. 6 to 9 show cross-sectional views of a heat-dissipation composite material according to an exemplary embodiment of the present invention, in which the positions of a metallic support layer as a support member are different.
Figure 7:
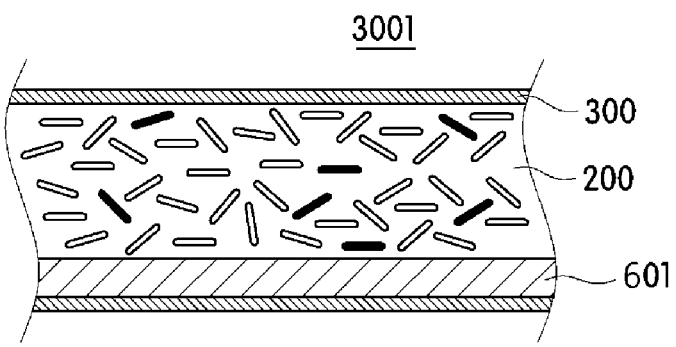
Figure 8:
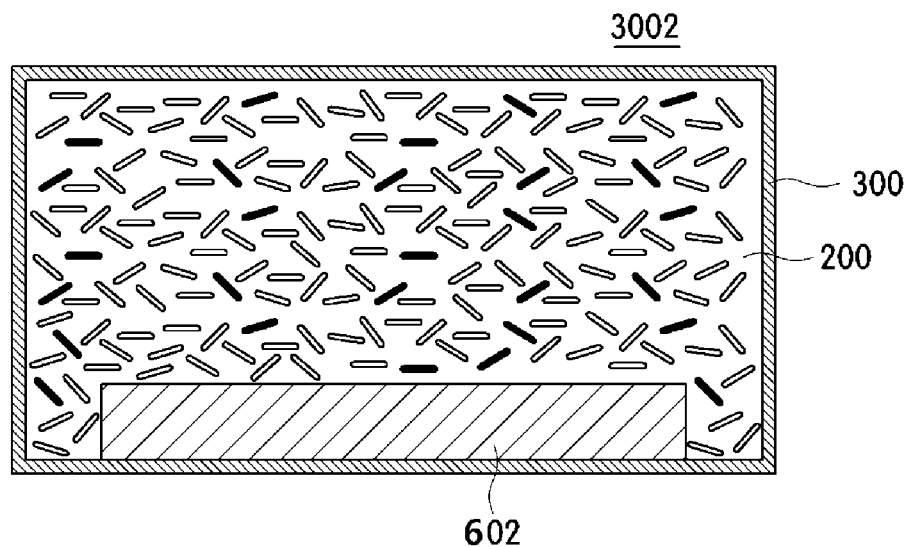
Figure 9:
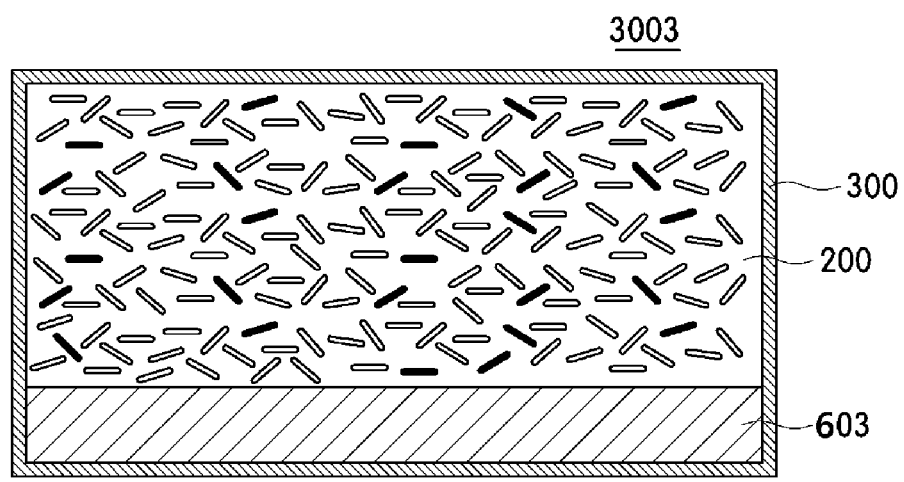

The metallic support layer 600, 601, 602 or 603 may be disposed in the polymer matrix 200 as shown in FIG. 6 and thus form an interface with the polymer matrix 200 on the entire surface thereof, or may be disposed such that the bottom surface of the metallic support layer 601 is not in contact with the polymer matrix 200 as shown in FIG. 7. In this case, as shown in FIG. 8, the metallic support layer 602 may be included to form the interface between the surfaces other than the bottom surfaces and the polymer matrix 200, or as shown in FIG. 9, the metallic support layer 603 may be included to form the interface with the polymer matrix 200 only with the top surface thereof.

The heat-dissipation filler 100 includes a graphite complex 101. The graphite complex 101, as shown in FIGS. 1A and 1B, includes nanoparticles 20 bound to the surface of the graphite 10.

Since the description of the graphite 10 is the same as that of the graphite of the graphite complex described in the first exemplary embodiment of the present invention, detailed description of the graphite 10 will be omitted.

Afterward, the nanoparticles 20 bound to the surface of the graphite 10 are included on the surface of the graphite 10 to serve as an anchor at the interface formed between the graphite complex 101 and the above-described polymer matrix 200 and/or the metallic support layer 600, 601, 602 or 603. Therefore, the lift-off at the interface between the graphite complex 101 and the polymer matrix 200 or inter-spacing of the polymer matrix 200 from the metallic support layer 600, 601, 602 or 603 may be prevented. In addition, the nanoparticles 20 serve as a medium which can further include a catecholamine layer on the graphite 10.

First, the function of the nanoparticles 20 as an anchor will be described. The metallic support layer 600, 601, 602 or 603 included to improve the mechanical strength of the heat-dissipation composite material is not easily bound to the interface formed with the polymer matrix 200 due to poor compatibility with a polymer compound of a different material, and thus there is a possibility that a lifting part is formed at the interface, or the lift-off of the interface, the cracking of the polymer matrix may easily occur due to impact during use.

Figure 10:
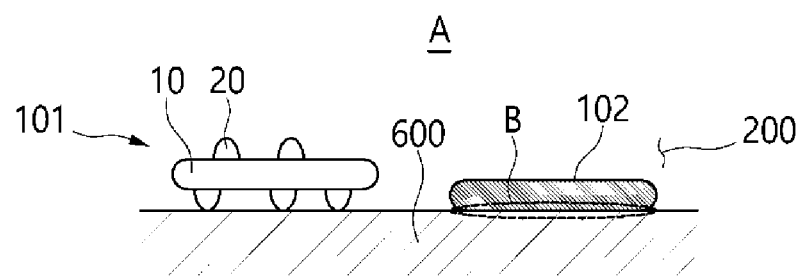
FIG. 10 is a partially enlarged view of part A of FIG. 6.

In addition, the metallic support layer 600, 601, 602 or 603 may easily have an interfacial lift-off phenomenon even when forming an interface with the heat-dissipation filler 100. That is, when a common heat-dissipation filler is disposed adjacent to the metallic support layer to form an interface between two materials, since the interface almost has no bonding strength, the polymer matrix 200 may easily lift from the metallic support layer 600, 601, 602 or 603 at a corresponding interfacial part. Referring to FIG. 10, the common heat-dissipation filler, like the graphite 102 having no anchor such as nanoparticles may form an interface with the metallic support layer 600, and since the metallic support layer is formed of a material different from the heat-dissipation filler, interfacial bonding strength is very poor, inter-spacing may occur at the corresponding interface (B), and the generated spacing may cause larger spacing due to vibration, resulting in cracking and peeling of the polymer matrix 200 in the corresponding part.

However, among the nanoparticles 20 included in the graphite complex 101, the nanoparticles in contact with the metallic support layer 600 serve as an anchor at the interface between the graphite 10 and the metallic support layer 600, and the nanoparticles in contact with the polymer matrix 200 serve as an anchor at the interface between the graphite 10 and the polymer matrix 200, and therefore, the inter-spacing phenomenon in which the polymer matrix 200 lifts from the metallic support layer 600 may be prevented. In addition, when the nanoparticles 20 are formed of a metallic material, the interfacial bonding property may be more improved. Therefore, the inter-spacing phenomenon occurring at the interface(s) between the heat-dissipation filler/metallic support layer and/or the polymer matrix/metallic support layer may be further prevented.

Meanwhile, the function of the nanoparticles 20 as a medium for forming a catecholamine layer is referred to in the description of the graphite complex in the description of the first exemplary embodiment of the present invention.

In addition, the nanoparticles 20 may be formed of a metallic or non-metallic material present as a solid at room temperature, and a non-limiting example of the material may be selected from alkali metals, alkaline earth metals, lanthanides, actinides, transition metals, post-transition metals and metalloids in the periodic table. As an example, the nanoparticles may be formed of Ni, Si, Ti, Cr, Mn, Fe, Co, Cu, Sn, In, Pt, Au, Mg and a combination thereof, and preferably, Cu, Ni or Si.

In addition, the nanoparticles 20 preferably have an average particle size of 5 to 100 nm, more preferably, 5 to 65 nm, and even more preferably, 10 to 50 nm, and thus may be suitable for serving as an anchor. When the nanoparticles have an average particle size of less than 5 nm, the function as an anchor for improving the interfacial bonding property between the metallic support layer and the polymer matrix may be insignificant. In addition, when the nanoparticles have an average particle size of more than 100 nm, it may be difficult to exhibit the interfacial bonding property at a desired level because the number of nanoparticles included on the graphite surface having a limited area is reduced. In addition, it is difficult to produce the nanoparticles in the form of a particulate bound on the graphite, and there is a risk that the nanoparticles are produced as single nano powder. In addition, even when being formed on the graphite, as the nanoparticles widely cover the outer surface of the graphite, the nanoparticles are difficult to be embodied in a particulate form, and thus are decreased in the function as an anchor. Further, as to be described below, when a catecholamine layer is introduced, as the amount of the catecholamine layer loaded in the graphite complex increases, the agglomeration between graphite complexes may be intensified, thereby reducing the dispersibility of the graphite complex in the polymer matrix, making it difficult to exhibit a uniform heat dissipation property, and significantly reducing the durability at the agglomerated part of the graphite complexes.

In addition, the nanoparticles 20 are preferably present in a crystallized particle state, and may be included to account for 10 to 70% of the total surface area of an individual graphite 10. In addition, the nanoparticles 20 may be included at 3 to 50 wt %, and preferably 3 to 20 wt % with respect to the total weight of the graphite complex 101. Here, the nanoparticles 20 may form a physical and/or chemical bond with the graphite 10 and thus exhibit higher bonding strength.

In addition, the graphite complex 101 may further include a catecholamine layer 30 on the surface of at least the above-described nanoparticles 20. The catecholamine layer 30 may exhibit excellent fluidity and dispersibility of graphite in the polymer compound, and improve the interfacial bonding property between the graphite complex and the polymer compound, and even more reduce the inter-spacing phenomenon of the polymer matrix 200 occurring on the surface of the metallic support layer 600, 601, 602 or 603 by improving the bonding strength between the graphite complex 101 and the metallic support layer 600, 601, 602 or 603 at the interface between the graphite complex 101 and the above-described metallic support layer 600, 601, 602 or 603. In addition, as the catecholamine layer 30 itself has reducing power and an amine group forms a covalent bond with a catechol group on the layer surface through a Michael addition reaction, secondary surface modification using the catecholamine layer as an adhesive material is possible, and for example, may serve as a bonding material capable of further introducing a polymer layer 40 for exhibiting further improved dispersibility in the polymer compound to the graphite 10.

The description of a catecholamine-based compound forming the catecholamine layer 30, and detailed description of the method of forming the catecholamine layer and its thickness are referred to in the descriptions of the first exemplary embodiment.

Meanwhile, the polymer layer 40 may be further applied onto the catecholamine layer 30 of the graphite complex 101, and the detailed description thereof is referred to in the description of the first exemplary embodiment.

In addition, the description of the method of preparing a graphite complex included in the second exemplary embodiment is also referred to in the description of the method of preparing a graphite complex in the first exemplary embodiment.

In addition, the heat-dissipation composite material 3000 according to an exemplary embodiment of the present invention may further include a heat-dissipation filler in addition to the graphite complex 101 as the heat dissipation filler 100, and the type of an addition heat-dissipation filler may be a known heat-dissipation filler. However, the agglomeration of the graphite complexes 101 is inhibited to more easily disperse the graphite complexes 101 in the polymer matrix 200, and to embody a lighter composite material, the heat-dissipation filler 100 may further include graphite 102 including one or more of graphite flakes (expandable graphite flake), expanded graphite and spherical graphite.

Here, the spherical graphite may be prepared in a spherical shape, for example, by grinding graphite flakes. When mixed with the polymer compound, the above-described graphite complex may further include a catecholamine to improve fluidity, dispersibility and an interfacial bonding property. However, when the content of the included catecholamine layer increases, due to the catecholamine layer, the agglomeration between the graphite complexes may rather occur. When the graphite complexes are disposed in the polymer matrix while agglomerated, it is difficult to exhibit a uniform heat dissipation property in the entire region of the heat-dissipation composite material, and the mechanical strength in the polymer matrix part in which the graphite complexes are agglomerated is significantly reduced, and thus cracking may easily occur or peeling from the metallic support layer may occur. However, as graphite including any one or more of graphite flakes, expanded graphite and spherical graphite is further included in the heat-dissipation filler, the agglomeration between the graphite complexes may be prevented, and the prepared composite material may exhibit uniform physical properties such as mechanical strength, a heat-dissipation property and electromagnetic shielding in every region.

In addition, the spherical graphite may improve vertical-direction thermal conductivity of the heat-dissipation composite material, and the expanded graphite and graphite flake may further improve the thermal conductivity and mechanical strength of the heat-dissipation composite material.

The graphite flake preferably has an average particle size of 10 to 1,000 μm, and more preferably, 50 to 500 μm. In addition, the expanded graphite has an average particle size of 50 to 1,000 μm, and more preferably, 100 to 500 μm. In addition, the spherical graphite has an average particle size of 10 to 100 μm, and more preferably 20 to 40 μm. When the average particle size of each type of graphite satisfies the above-mentioned numerical range, it may be very advantageous for inhibiting the above-described agglomeration of the graphite complexes as well as the improvement in thermal conductivity. In addition, the release of graphite from the heat-dissipation composite material, which is caused by the decrease in the particle size may be inhibited. In addition, when each type exceeds the upper limit of the preferable particle size range, the reduction in fluidity of graphite in a melted polymer compound or the reduction in surface quality in the heat-dissipation composite material may be prevented.

Meanwhile, when the average particle size of graphite is smaller than that of the above-described graphite complex 101, linkages between some of the graphite may be formed, and in this case, close packing in the polymer matrix is possible using the bimodality of a large particle and a small particle, and more excellent thermal conductivity may be achieved.

In addition, the graphite 102 including any one or more of graphite flakes, expanded graphite and spherical graphite is preferably included at a weight ratio of 1:1 to 25, and more preferably, 1:1 to 15 with respect to the weight of the graphite complex. When the graphite is included at a weight ratio of less than 1:1 with respect to the weight of the graphite complex, the degree of improving heat dissipation performance caused by the added graphite is insignificant, and it may be difficult to prevent the agglomeration of the graphite complexes. In addition, as most of the heat-dissipation filler has to be provided with graphite complexes, there is a risk of the increase in production cost, and it is not preferable for the reduction in weight of the composite material to be embodied. Meanwhile, when the graphite is included at a weight ratio of more than 1:25 with respect to the weight of the graphite complex, the heat dissipation property of the composite material to be embodied may be reduced, and particularly, in the process of preparing a composite material, because of the reduction in fluidity of the heat-dissipation filler fluidity, the graphite may be concentrated in the center of the composite material, rather than at the surface thereof, and therefore, the radiation of heat to be conducted and vertical thermal conductivity may be significantly reduced. In addition, because of the reduction in the interfacial bonding property between different materials, the inter-spacing at the interface between the polymer matrix and the graphite, and the interface between the polymer matrix and the metallic support layer may occur more frequently and severely.

Meanwhile, according to an exemplary embodiment of the present invention, the graphite further included as the heat-dissipation filler 100, other than the graphite complex 101, may be expanded graphite, and therefore, compared to different types of graphite, types of mechanical strength such as tensile strength, flexural rigidity, flexural modulus and impact strength and horizontal thermal conductivity may be achieved at higher levels.

In addition, according to an exemplary embodiment of the present invention, the graphite further included as the heat-dissipation filler 100, other than the graphite complex 101, may be graphite flakes and expanded graphite. In this case, it may be preferable for achieving increased horizontal thermal conductivity and improved mechanical strength as well as excellent tensile strength, compared to the case in which, particularly, only one of expanded graphite and graphite flakes is included. More preferably, the expanded graphite and the graphite flakes are included at a weight ratio of 1:1 to 20, and more preferably, 1:1 to 13. When the graphite flake is included at a weight ratio of less than 1:1 with respect to the weight of the expanded graphite, fluidity may be reduced while being mixed with a melted polymer compound, and thus it may be difficult to perform injection molding, which means that it may be difficult to attain the object of the present invention. In addition, when the graphite flake is included at a weight ratio of 1:25 with respect to the weight of the expanded graphite, it may be difficult to achieve the increase in horizontal thermal conductivity. In addition, types of mechanical strength such as tensile strength, flexural modulus and impact strength may be reduced.

Meanwhile, the heat-dissipation composite material 3000, 3001, 3002 or 3003 may further include additives such as a strength modifier, an impact modifier, an antioxidant, a thermal stabilizer, a light stabilizer, a plasticizer, a dispersing agent, a work modifier, a coupling agent, a UV absorbent, an antistatic agent, and a flame retardant, and detailed description thereof is referred to in the description in the first exemplary embodiment.

In addition, the heat-dissipation composite material 3000, 3001, 3002 or 3003 may further include a protective coating layer 300 on the outer surface of the polymer matrix 200. The protective coating layer 300 prevents the release of the heat-dissipation filler disposed at the surface of the polymer matrix, prevents a scratch caused by physical stimuli applied on the surface thereof, and provides an insulating function, and therefore, it can be used in electronic devices requiring both insulation and heat dissipation.

The protective coating layer 300 may be formed of a known thermosetting polymer compound or thermoplastic polymer compound. The thermosetting polymer compound may be one type of compound selected from the group consisting of an epoxy-based resin, a urethane-based resin, an ester-based resin and a polyimide-based resin, or a mixture or copolymer of two or more thereof. In addition, the thermoplastic polymer compound may be one type of compound selected from the group consisting of polyamide, polyester, polyketone, a liquid crystal polymer, polyolefin, polyphenylene sulfide (PPS), polyether ether ketone (PEEK), polyphenylene oxide (PPO), polyethersulfone (PES), polyetherimide (PEI) and polyimide, or a mixture or copolymer of two or more thereof, but the present invention is not limited thereto.

The protective coating layer 300 preferably has a thickness of 0.1 to 1000 μm, and more preferably, 0.1 to 100 μm, but the present invention is not limited thereto. The thickness may vary according to purpose.

Meanwhile, the protective coating layer 300 may serve to inhibit the radiation of heat conducted by the graphite complex 101 and the metallic support layer 600, 601, 602 or 603 to the air. For this reason, to achieve more improved heat dissipation and improved heat radiation to the air, the protective coating layer 300 may be a heat-dissipation coating layer further including a heat-dissipation filler. In addition, the protective coating layer 300 may include a pigment. As the graphite complex is included as the heat-dissipation filler, the heat-dissipation composite material 3000, 3001, 3002 or 3003 may be dark or almost black, and in this case, due to its color issues, the use of the graphite composite material may be avoided in some applications. For this reason, the protective coating layer 300 may further include a known pigment expressing a desired color.

The graphite composite materials and heat-dissipation composite materials according to the first and second exemplary embodiments of the present invention may be embodied as electrical/electronic parts. The electrical/electronic parts may be parts of electrical/electronic devices used in various industries such as the battery field, the automotive field, the lighting field, the aerospace field and the display field, and particularly, parts requiring both heat dissipation performance and durability. In addition, for the parts, the heat-dissipation composite material according to the present invention may be employed as a heat dissipation housing, a heat-dissipation support member, a thermal radiation board or a heat sink. However, the field in which the heat-dissipation composite material according to the present invention is used and a specific use thereof are not limited thereto.

EXAMPLES

The present invention will be described in further detail with reference to the following examples. However, the following examples do not limit the scope of the present invention, and it should be understood that the examples are provided to help in understanding the present invention.

Example 1

Raw material powder was prepared by mixing plate-shaped expanded graphite having an average particle size of 300 μm and nickel powder in a mixing ratio of 1:19 (weight ratio) for 10 minutes. In addition, argon gas was injected into a radio-frequency thermal plasma device at 30 lpm and 50 lpm as a central gas and sheath gas, respectively. Subsequently, after high-temperature thermal plasma was generated using a plasma torch power supply with a power of 17 kW, and before injection of the raw material powder, the degree of vacuity of the equipment was maintained at 500 torr, the prepared raw material powder was injected into a radio-frequency thermal plasma reactor through a spray nozzle of a plasma generating electrode unit. Inside the thermal plasma reactor, the graphite was transported without thermal damage by the plasma, and only nickel powder was crystallized to nanoparticles through selective vaporization to be bound with the graphite. The aggregate formed by bonding the graphite with the nickel nanoparticles was separated in a cyclone unit and adsorbed onto a filter of a collector via a conveying pipe, and the powder adsorbed onto the filter was collected in a collecting unit through a blowback process.

Afterward, to form a catecholamine layer on the captured aggregate, 2 mM dopamine was dissolved in a Tris buffer solution (TBS, 100 mM), and 5 g of the aggregate was mixed in 1 L of the solution and stirred at room temperature under atmospheric conditions for 2 hours. To increase the reaction speed between the dopamine and the nickel nanoparticles, sodium periodate was added at 10% of the dopamine weight and stirred. After stirring for 2 hours, an unreacted material was removed through filtering, washed with di-water twice, and then dried at room temperature, thereby preparing a polydopamine-coated graphite complex (hereinafter, represented as "GC"). In the prepared graphite complex, wt % of the graphite, nanoparticles and polydopamine was 94.95 wt %, 5 wt % and 0.05 wt %, respectively. In addition, from an SEM image, the nanoparticles were confirmed to have an average particle size of 32 nm.

After a graphite composition was prepared by mixing the prepared graphite complex and expanded graphite (hereinafter, referred to as "EG" in Tables 1 to 3) at a weight ratio of 1:9, a pellet was prepared by mixing the graphite composition with polyamide-6, which is a thermoplastic polymer, at a weight ratio of 1:1, inputting the resulting mixture into a main hopper and a side feeder of a coaxial twin screw extruder, and melting the mixture in an extruder barrel at 280° C. by a Strand cutting method, and then the pellet was dried in a convection oven, thereby preparing a masterbatch for a graphite composite material.

Examples 2 to 18

Masterbatches for a graphite composite material were prepared in the same manner as in Example 1, except for using various graphite compositions as shown in Tables 1 to 3 below. Here, in Tables 1 to 3, graphite flakes were represented as "GF" and had an average particle size of 75 μm, and spherical graphite was represented as "RG" and had an average particle size of 40 μm.

Comparative Example 1

A masterbatch for a graphite composite material was prepared in the same manner as in Example 1, except that graphite was not introduced into a graphite composition and only a graphite complex was included.

Comparative Example 2

A masterbatch for a graphite composite material was prepared in the same manner as in Example 1, except that, instead of graphite of the graphite composition, carbon black having an average particle size of 330 nm was introduced at the same content.

Experimental Example

An injection-molded product was prepared by inputting each of the masterbatches prepared in Examples 1 to 18 and Comparative Examples 1 to 2 into a conventional injection molding device, and the following physical properties were evaluated, and the result is shown in Tables 1 to 3. Here, the size and shape of each injection-molded specimen were determined to be suitable for the methods of evaluating a physical property as follows.

1. Horizontal Thermal Conductivity

The horizontal thermal conductivity of a specimen was measured according to ASTM E1461.

2. Tensile Strength

The tensile strength of a specimen was measured according to ASTM D638.

3. Impact Strength

Impact strength was measured according to ASTM D256.

TABLE 1

| | | Example 1 | Example 2 | Example 3 | Example 4 | Example 5 | Example 6 | Example 7 |
|---|---|---|---|---|---|---|---|---|
| Graphite composition | GC:Graphite weight ratio | 1:9 | 1:14.7 | 1:17 | 1:24.5 | 1:26 | 1:3 | 1:1.2 |
| | Graphite type and mixing weight ratio | EG | EG | EG | EG | EG | EG | EG |
| Graphite composite material | PA-6:Graphite composition weight ratio | 1:1 | 1:1 | 1:1 | 1:1 | 1:1 | 1:1 | 1:1 |
| | Horizontal thermal conductivity (W/mK) | 14.2 | 14.5 | 14.5 | 14.7 | 14.9 | 13.8 | 13.9 |
| | Tensile strength (Kgf/cm$^2$) | 855 | 860 | 830 | 810 | 790 | 840 | 830 |
| | Impact strength (Kgf·cm/cm) | 3.52 | 3.53 | 3.20 | 3.18 | 2.58 | 3.52 | 3.35 |

(※GC: graphite complex, EG: expanded graphite, PA-6: polyamide-6)

TABLE 2

| | | Example 8 | Example 9 | Example 10 | Example 11 | Example 12 | Example 13 | Example 14 |
|---|---|---|---|---|---|---|---|---|
| Graphite composition | GC:Graphite weight ratio | 1:0.7 | 1:9 | 1:9 | 1:9 | 1:9 | 1:9 | 1:9 |
| | Graphite type and mixing weight ratio | EG | GF | RF | EG + RG/ 1:8 | EG + GF/ 1:8 | EG + GF/ 1:13 | EG + GF/ 1:15 |
| Graphite composite material | PA-6:Graphite composition weight ratio | 1:1 | 1:1 | 1:1 | 1:1 | 1:1 | 1:1 | 1:1 |
| | Horizontal thermal conductivity (W/mK) | 14.2 | 13.20 | 8.30 | 9.3 | 14.8 | 14.5 | 13.7 |

TABLE 2-continued

|  | | Example 8 | Example 9 | Example 10 | Example 11 | Example 12 | Example 13 | Example 14 |
|---|---|---|---|---|---|---|---|---|
| | Tensile strength (Kgf/cm$^2$) | 790 | 820 | 670 | 710 | 840 | 855 | 832 |
| | Impact strength (Kgf · cm/cm) | 2.71 | 2.93 | 3.62 | 3.45 | 3.69 | 3.60 | 3.49 |

(※GC: graphite complex, EG: expanded graphite, GF: graphite flakes, RF: spherical graphite, PA-6: polyamide-6)

TABLE 3

| | | Example 15 | Example 16 | Example 17 | Example 18 | Comparative Example 1 | Comparative Example 2 |
|---|---|---|---|---|---|---|---|
| Graphite composition | GC:Graphite weight ratio | 1:9 | 1:9 | 1:9 | 1:9 | 1:0 | 1:9 |
| | Graphite type and mixing weight ratio | EG + GF/ 1:19.5 | EG + GF/ 1:22 | EG + GF/ 1:5.3 | EG + GF/ 1:4 | — | Carbon black |
| Graphite composite material | PA-6:Graphite composition weight ratio | 1:1 | 1:1 | 1:1 | 1:1 | 1:1 | 1:1 |
| | Horizontal thermal conductivity (W/mK) | 13.8 | 13.5 | 14.7 | 14.3 | 14.0 | 3.3 |
| | Tensile strength (Kgf/cm$^2$) | 830 | 785 | 807 | 780 | 789 | 580 |
| | Impact strength (Kgf · cm/cm) | 3.30 | 3.05 | 3.48 | 3.10 | 2.40 | 3.80 |

(※ GC: graphite complex, EG: expanded graphite, GF: graphite flakes, PA-6: polyamide-6)

As seen from Tables 1 to 3, it can be confirmed that Comparative Example 1 including only a graphite complex, compared to Examples including a different type of graphite, in addition to the graphite complex, exhibited significantly poor tensile strength and impact strength.

In addition, it can be confirmed that Comparative Example 2 including carbon black, rather than a carbon material or graphite, exhibited significantly poor thermal conductivity.

Meanwhile, among the examples, compared to Example 9 including graphite flakes and Example 10 including spherical graphite, Example 1 including graphite, specifically, expanded graphite, exhibited excellent thermal conductivity and mechanical strength, and there is a synergistic effect because of the combination of the graphite complex and the expanded graphite.

Example 19

Raw material powder was prepared by mixing graphite, specifically, plate-shaped expanded graphite having an average particle size of 300 μm, and nickel powder in a mixing ratio of 1:19 (weight ratio) for 10 minutes. In addition, argon gas was injected into a radio-frequency thermal plasma device at 30 lpm and 50 lpm as a central gas and sheath gas, respectively. Subsequently, after high-temperature thermal plasma was generated using a plasma torch power supply with a power of 17 kW, and before injection of the raw material powder, the degree of vacuity of the equipment was maintained at 500 torr, the prepared raw material powder was injected into a radio-frequency thermal plasma reactor through a spray nozzle of a plasma generating electrode unit. Inside the thermal plasma reactor, the graphite was transported without thermal damage by the plasma, and only nickel powder was crystallized to nanoparticles through selective vaporization to be bound with the graphite. The graphite complex prepared thereby was separated in a cyclone unit and adsorbed onto a filter of a collector through a conveying pipe, and then the powder adsorbed onto the filter was captured in a collecting unit through a blowback process. The graphite and the nanoparticles in the prepared graphite complex were 94.98 wt % and 5.02 wt %, respectively. In addition, from an SEM image, the average particle size of the nanoparticles was confirmed to be 32 nm.

A pellet was prepared by mixing polyamide-6, which is a thermoplastic polymer, with the prepared graphite complex in a weight ratio of 1:1, inputting the resulting mixture into a main hopper and a side feeder of a coaxial twin screw extruder, and melting the mixture in an extruder barrel at 280° C. by a Strand cutting method, and then the pellet was dried in a convection oven, thereby preparing a masterbatch for a graphite composite material.

A heat-dissipation composite material having the structure shown in FIG. 6 was prepared by preparing an aluminum plate having a size of 12 cm×6 cm×1.5 mm (width×length×thickness) as a metallic support layer in addition to the prepared masterbatch, and performing injection molding such that a polymer matrix formed through a melted masterbatch covers the entire surface of the metallic support layer with a thickness of 3 mm using a conventional injection molding device.

Example 20

A graphite complex was prepared in the same manner as in Example 19, except that a catecholamine layer was further formed on nanoparticles of a prepared graphite complex, and then a heat-dissipation composite was prepared using the graphite complex.

Specifically, the graphite complex having the catecholamine layer was prepared by the following preparation method. To further form the catecholamine layer, 2 mM dopamine was dissolved in a Tris buffer solution (TBS, 100 mM), and 5 g of the graphite complex having the nanoparticles was mixed in 1 L of the solution and stirred at room temperature under atmospheric conditions for 2 hours. To increase the reaction speed between the dopamine and the nickel nanoparticles, sodium periodate was added at 10% of the dopamine weight and stirred. After stirring for 2 hours, an unreacted material was removed through filtering, washed with di-water twice, and then dried at room temperature, thereby preparing a polydopamine-coated graphite complex. In the prepared graphite complex, wt % of the graphite, nanoparticles and polydopamine was 94.95 wt %, 5 wt % and 0.05 wt %, respectively.

Examples 21 to 27

Heat-dissipation composite materials were prepared in the same method as in Example 20, except that the average particle size of nanoparticles formed on graphite was changed as shown in Table 4 below by adjusting the mixing ratio of graphite and nickel powder, which are the mixed components.

Comparative Example 3

A heat-dissipation composite material was prepared as shown in Table 4 below in the same manner as in Example 19, except that a masterbatch was prepared only with graphite without forming nanoparticles on the graphite.

Experimental Example 2

Physical properties of the heat-dissipation composite materials prepared according to Examples 19 to 27 and Comparative Example 3 were evaluated, and the result is shown in Table 4 below.
1. Interfacial Bonding Property
A specimen was cross-cut with a knife at an interval of 1 mm Afterward, a scotch tape was attached to the cut surface, and then pulled off at an angle of 60° to check the state of the polymer matrix being peeled off.
After removing the scotch tape, an area of the polymer matrix peeled off from the surface of the specimen in the evaluated entire area was calculated, and the peeled area was represented as a percentage. Specifically, 0% means no peeling, and 100% means total peeling.
2. Durability Evaluation
A heat-dissipation composite material was disposed in a chamber at a temperature of 60° with a relative humidity of 90% for 2,000 hours, the surface condition of the heat-dissipation composite material was visually evaluated. As the evaluation result, after checking for cracking or lift-off of the polymer matrix, if there was no abnormality, it was represented as ○, and if there was an abnormality, it was represented as x.

TABLE 4

|  |  | Example 19 | Example 20 | Example 21 | Example 22 | Example 23 | Example 24 | Example 25 | Example 26 | Comparative Example 3 |
|---|---|---|---|---|---|---|---|---|---|---|
| Graphite complex | Graphite average particle size (μm) | 300 | 300 | 300 | 300 | 300 | 300 | 300 | 300 | 300 |
|  | Nanoparticle average particle size (nm) | 32.3 | 32.3 | 50.0 | 63.2 | 69.7 | 10.5 | 6.7 | 4.4 | 0 |
|  | Formation of catecholamine layer | x | ○ | ○ | ○ | ○ | ○ | ○ | ○ | x |
| Heat-dissipation composite material | Interfacial bonding strength (%) | 88.0 | 100 | 98.6 | 90.1 | 87.5 | 94.8 | 86.9 | 80.3 | 66.6 |
|  | Durability | ○ | ○ | ○ | ○ | x | ○ | ○ | x | x |

As seen from Table 4, it can be confirmed that, compared to simple graphite, in Example 19 having nanoparticles on graphite, an heat-dissipation composite material exhibits significantly excellent interfacial bonding strength, and therefore it can be seen that the nanoparticles serve as an anchor between an aluminum plate and a polymer matrix, which are different materials.

In addition, it can be confirmed that, compared to Example 19 including the graphite complex only having the nanoparticles, in Example 20 including a catecholamine layer, the heat-dissipation composite material exhibits excellent interfacial bonding strength due to the graphite complex.

On the other hand, it can be confirmed that Example 26 in which the size of nanoparticles serving as an anchor is smaller than a preferable range of the present invention exhibits a lower interfacial bonding strength and poor durability, compared to other examples.

In addition, in Example 23 in which the size of nanoparticles is larger than a preferable range, the interfacial bonding strength is slightly reduced, but there was an abnormal durability evaluation result. It was expected that this was because the amount of the catecholamine layer formed was increased by an increase in the particle size of the nanoparticles formed on the graphite, and thus the dispersibility in the polymer matrix was reduced according to the agglomeration between graphite complexes.

Although exemplary embodiments of the present invention have been described above, the spirit of the present invention is not limited to the exemplary embodiments presented herein, and it will be understood by those of ordinary skill in the art that other exemplary embodiments may be easily suggested by adding, changing, deleting or adding components within the scope of the same idea and also included in the scope of the spirit of the present invention.

The invention claimed is:

1. A graphite composition, comprising:
   a graphite complex in which nanoparticles are fixed on a graphite surface; and
   at least any one graphite of graphite flakes, spherical graphite and expanded graphite.

2. The graphite composition of claim 1, wherein the graphite complex further comprises a catecholamine layer coated on at least the nanoparticles.

3. The graphite composition of claim 2, wherein the graphite complex further comprises a polymer layer coated on at least the catecholamine layer.

4. The graphite composition of claim 1, wherein the graphite complex has an average particle size of 10 to 900 µm.

5. The graphite composition of claim 1, wherein the graphite flake has an average particle size of 10 to 1,000 µm, the expanded graphite has an average particle size of 50 to 1,000 µm, and the spherical graphite has an average particle size of 10 to 100 µm.

6. The graphite composition of claim 1, wherein the graphite is expanded graphite.

7. The graphite composition of claim 1, wherein the graphite comprises
   graphite flakes and expanded graphite, and
   the expanded graphite and the graphite flakes are comprised at a weight ratio of 1:1 to 20.

8. The graphite composition of claim 1, wherein the graphite complex and the graphite are comprised at a weight ratio of 1:1 to 25.

9. The graphite composition of claim 7, wherein the graphite comprises
   graphite flakes and expanded graphite, and
   the expanded graphite and the graphite flakes are comprised at a weight ratio of 1:1 to 13.

10. The graphite composition of claim 8, wherein the graphite complex and the graphite are comprised at a weight ratio of 1:1 to 15.

11. A graphite composite material, comprising:
    a polymer matrix molded by comprising a thermoplastic polymer compound; and
    a heat-dissipation filler comprising the graphite composition of claim 1 dispersed in the polymer matrix.

12. The graphite composite material of claim 11, further comprising:
    a protective coating layer at least on the outer surface of the polymer matrix.

13. A heat-dissipation composite material, comprising:
    the graphite composite material of claim 11; and
    a support member comprised to form at least one interface with a polymer matrix of the graphite composite material.

* * * * *